United States Patent [19]

Nakamura et al.

[11] Patent Number: 5,361,244
[45] Date of Patent: Nov. 1, 1994

[54] OPTICAL HEAD AND INFORMATION RECORDING APPARATUS

[75] Inventors: Shigeru Nakamura, Tachikawa; Akira Arimoto, Kodaira; Takeshi Nakao, Sagamihara; Mariko Umeda, Tokyo, all of Japan

[73] Assignee: Hitachi, Ltd., Tokyo, Japan

[21] Appl. No.: 865,114

[22] Filed: Apr. 8, 1992

Related U.S. Application Data

[63] Continuation-in-part of Ser. No. 772,443, Oct. 7, 1991.

[30] Foreign Application Priority Data

Apr. 10, 1991 [JP] Japan .................. 3-077567
Jul. 12, 1991 [JP] Japan .................. 3-172174

[51] Int. Cl.$^5$ .................. G11B 7/00
[52] U.S. Cl. .................. 369/44.23; 369/44.12; 369/44.26; 369/44.34; 369/44.35
[58] Field of Search .......... 369/44.37, 44.11, 44.13, 369/44.14, 54, 44.26, 44.41, 44.42, 44.23, 109, 44.12, 110, 112, 44.38, 44.35, 44.36, 44.34, 44.24; 250/201.2

[56] References Cited

U.S. PATENT DOCUMENTS

| | | | |
|---|---|---|---|
| 4,689,479 | 8/1987 | Tatsuno et al. | 369/109 |
| 4,978,844 | 12/1990 | Ujihara | 369/112 |
| 5,050,155 | 9/1991 | Kurata et al. | 369/44.14 |
| 5,062,098 | 10/1991 | Hori et al. | 369/44.12 |
| 5,095,472 | 3/1992 | Uchino et al. | 369/44.14 |
| 5,132,948 | 7/1992 | Ishibashi | 369/44.34 |
| 5,161,148 | 11/1992 | Hori et al. | 369/44.23 |

FOREIGN PATENT DOCUMENTS 59-58537 4/1984 Japan .
1303632 12/1989 Japan .

Primary Examiner—W. R. Young
Assistant Examiner—Nabil Handi
Attorney, Agent, or Firm—Antonelli, Terry, Stout & Kraus

[57] ABSTRACT

Disclosed herein is a compact, adjustment-free, unitary optical head wherein diffraction grating made of a birefrigence material and having convexities and concavities of grating grooves so set that the difference of their optical path lengths is some multiples and a half of the wavelength for an ordinary beam and an extraordinary beam, a diffraction grating providing astigmatisms to ±1 order beams, a quarter wavelength plate, and other optical components, are interposed between a semiconductor laser and a focussing lens and are stored inside an optical head body filled with a dry nitrogen gas. A focus error detection signal is obtained from the difference of the degrees of modulation of the ±1 order reflected beams by pre-wobbled pits, and adjustment of the optical beam can be carried out by driving the body by a two-directional head actuator.

17 Claims, 20 Drawing Sheets

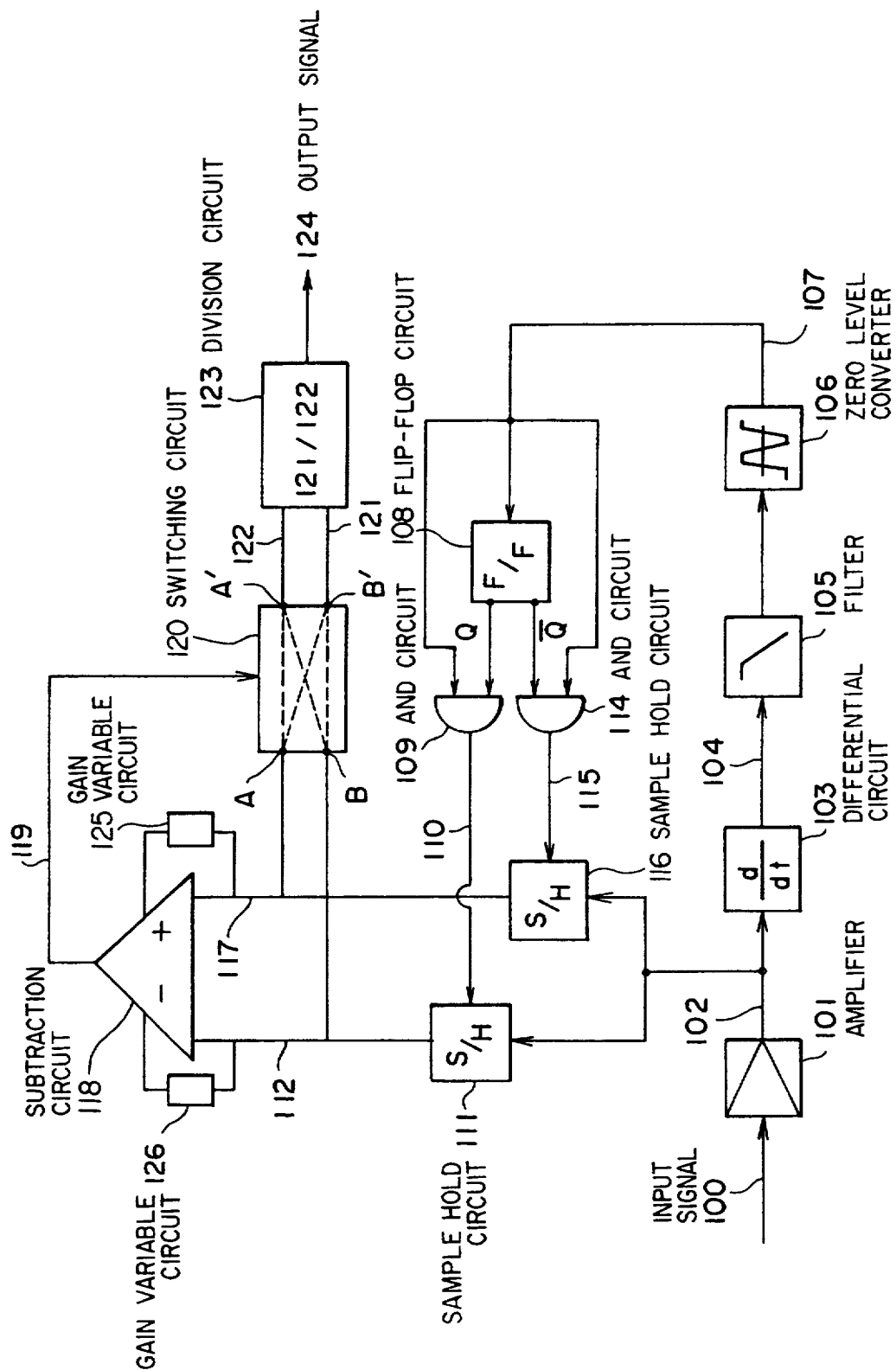

OPTICAL HEAD AND INFORMATION RECORDING APPARATUS

CROSS-REFERENCE TO RELATED APPLICATION

The present application is a continuation-in part of a copending U.S. application Ser. No. 772,443 filed Oct. 7, 1991, pending, entitled "Optical Information Processing Apparatus and Method of Controlling the Apparatus" by Shigeru NAKAMURA, et al. and assigned to the herein by reference.

BACKGROUND OF THE INVENTION

This invention relates to an optical head and an information medium that are used in optical information processing apparatuses such as optical disks apparatuses, optical card apparatuses an optical tape apparatuses.

In the optical head used in the optical disk apparatuses, etc., an outgoing beam from a semiconductor laser, or the like, is irradiated to an information medium such as an optical disk, by a focussing lens, the reflected beams from the disk are converged again by the focussing lens, are then separated from the outgoing beam from the semiconductor laser by a beam separation optical system, the reflected beams from the disk thus separated are received by optical detectors, a focus error detection signal and a track error detection signal are generated from the optical detector outputs and are supplied to a two-directional lens actuator, for example, and the focussing lens is moved in the direction of the optical axis of the lens and in the radial direction of the disk in order to make focussing control as well as tracking control and at the same time to generate an information reproduction signal from the optical detector outputs.

The structure of the ordinary optical head necessary for accomplishing the function described above such as a light source, the beam separation optical system, the optical detectors, the two-directional lens actuator, and so forth, is firmly fixed to a body. However, to accomplish the focussing control and the tracking control, the focussing lens is movably supported through a spring of the two-directional lens actuator fixed to the optical head body. For this reason, the optical head is not sealed as a whole. A semiconductor laser chip which is relatively compact in size and has a high output is used as the light source of the optical head. The semiconductor laser chip is fixed to a substrate of a package to which lead wires for electrodes are fitted, and is sealed by a cap equipped with a glass window. In this manner, degradation of a light emission end surface of the semiconductor laser chip is prevented and the laser output is stabilized.

One of the focus error detection systems employed for the optical head such as the optical disks utilizes the changes of the shape and beam intensity distribution of the disk reflected beams, receives the beams by a multiple division optical detector and uses the unbalance of its D.C. output signals as the focus error signal.

The astigmatic method disclosed in JP-A-59-58537, for example, provides astigmatism to disk reflected beams by an astigmatic device such as a cylindrical lens. In other words, the astigmatic device provides astigmatism such that the disk reflected beams form two focal lines in mutually orthogonal directions. The disk reflected beams become round at a substantial center of these two focal lines. When the disk reflected beams are received by a quadrature detector, the shape of the reflected beam on the surface of the quadrature detector is substantially round if the disk exists on the focal point and becomes linear in mutually crossing directions if the disk deviates from the focal point. Accordingly, the focus error detection signal can be obtained by adding D.C. output signals of optical detection elements existing at mutually diagonal positions in the quadrature detector and calculating the difference of the two D.C. addition signals.

Another method has been proposed which makes focus error detection by the use of a diffraction grating which forms optical spots at different positions in the direction of the focal depth.

The method of JP-A-1-303632, for example, provides aberration of the longitudinal movement of positive and negative image points to a +1 order beam and a −1 order beam (aberration of the focus error) by the use of a diffraction grating comprising a part of the aggregate of a plurality of concentric grooves the groove pitch of which increases or decreases sequentially. The center of this diffraction grating is not coincident with the major optical axes of the main beam. In other words, since the concentric grooves of the diffraction grating are eccentric with respect to the major optical axis of the main beam, the +1 order beam and the −1 order beam are emitted in directions opposite to the major optical axis of the main beam. These +1 order beam and −1 order beam are focused by a focussing lens as two side spots at different positions in the direction of the focal depth relative to the main beam. The light power of the reflected beams from these two side spots is modulated by a signal recorded on the optical disk and the degree of modulation is detected by the optical detection device and an envelop detection circuit. Since the degree of modulation by the two side spots changes in accordance with the focus error of the optical disk, the focus error signal can be obtained by calculating the difference between the two degrees of modulation.

Next, an example of a beam separation optical system for separating a reflected beam from a recording medium and a beam from a light source such as an optical disk will be explained.

According to JP-A-59-58537 described above, for example, the beam separation optical system comprises a polarizing prism and a quarter wavelength plate. In this beam separation optical system, the polarizing direction of the linearly polarized beam turns by 90° when the laser beam reciprocates on the quarter wavelength plate. Therefore, the two beams can be separated completely by the polarizing prism. The polarizing prism that is used generally is a cubic polarizing beam splitter produced by sandwiching dielectric multi-layers between two triangular prisms, and separates the reflected beam in the orthogonal direction.

The optical head of the compact disk, etc, does not use the quarter wavelength plate so as to reduce the number of optical components but uses a half prism or a half mirror for separating about the half of the disk reflected beam in the orthogonal direction as the beam separation optical system.

Besides the prior art described above, JP-A-2-216629 discloses a compact optical head having a structure wherein a diffraction grating or a holographic device is inserted between a semiconductor laser and a focussing lens, and a reflected beam from an optical disk is separated from an outgoing beam from the semiconductor laser at a very fine angle, so that an optical detector can be mounted to the semiconductor laser adjacent thereto.

SUMMARY OF THE INVENTION

When on optical head is fabricated, scale-down of the optical head is limited so long as a semiconductor laser sealed in a case is used as a light source because the light source portion has a predetermined size. Therefore, it may be conceivable to directly fit a semiconductor laser chip to an optical head body as a method of reducing the size of the optical head. As described already, however, the inside of the optical head body is not sealed in the conventional optical head body and the semiconductor laser chip is directly exposed to external air flowing from the open portion of the optical head body and a spring portion of a two-directional lens actuator and containing a moisture. Therefore, if the optical head is used for a long period or is stored or used in an environment having a high moisture content, the end surface of the semiconductor laser chip, etc., undergoes degradation and laser oscillation gets unstabilized, so that performance of the optical head becomes unstable. For this reason, the semiconductor laser chip cannot be fitted directly to the optical head body and this is the critical problem for accomplishing scale-down of the optical head.

Scale-down of the optical head involves another problem.

According to the astigmatic method described in JP-A-59-58537, for example, a disk position at which a data signal becomes maximal or a disk position at which the light power of the reflected beam becomes maximal is detected by a measurement system which is separated from the focussing system, in order to establish focussing of the focus error detection optical system, and the position of the quadrature detector and the position of a detecting lens must be adjusted so that each optical detection device of the quadrature detector receives an equal quantity of beam and outputs a D.C. signal of an equal level so as to bring the focus error detection signal to a zero level. To this end, a high precision position adjustment mechanism for optical components must be provided to the optical head and hence, scale-down of the optical head becomes difficult. In addition, assembly and adjustment of the optical head are time consuming, and if the fitting positions of optical components deviate due to the temperature change, etc, the position of the luminous flux on the multi-division detector deviates, so that a D.C. unbalance occurs in the output of each optical detector of the multi-division detector and the disk position at which the focus error detection signal reaches the zero level deviates from the target focussing position, generating thereby an offset in the focus error detection signal.

On the other hand, JP-A1-303632 described above is directed to solve the problem described above, but this reference does not examine sufficiently the arrangement of pits for obtaining the focus error detection signal having the highest stability and the structure of the diffraction grating which determines the shape of the side spots. Accordingly, there remains the problem that a starting action of auto-focusing servo becomes unstable due to the drop of the degrees of modulation resulting from the relative position error (track offset) of the side spots and the pit in the radial direction of the optical disk. Generally, auto-focusing control in the optical disk apparatus must be carried out before automatic tracking control, and should not therefore be affected by the error in the radial direction of the optical disk.

This problem will be explained further with reference to FIG. 18. FIGS. 18(1) and 18(2) show the spot shapes and pits on the optical disk when the diffraction grating having a plurality of concentric grooves, which is disclosed in JP-A-1-303632, is used. Reference numeral 350a denotes a main spot on the surface of the optical disk, 350b and 350c are sub-spots on the optical disk surface, 351 is a track, and 352 is a pit recorded on the track 351. The diffraction grating having the concentric grooves provides the aberration of the longitudinal movement of positive and negative image points (aberration of the focus error) to the +1 order beam and the −1 order beam. Therefore, the +1 order beam and the −1 order beam are focused by the focussing lens to different positions in the direction of the focal depth relative to the main beam. FIGS. 18(1) and 18(2) show the spot shapes at the convergent position of the −1 order beam deviated from the focal position of the main beam, and also show the state where the sub-spot 350c is the smallest. FIG. 18(1) shows the case where three spots pass on the track 351, and the reflected beam of the sub-spot 350c is greatly modulated by the pit 352. When the deviation of the optical disk is in the opposite direction and the sub-spot 350b becomes the smallest, though not shown in FIG. 18, the reflected beam of the sub-spot 350b is greatly modulated by the pit 352. Therefore, when the three spots pass on the track 351 as shown in FIG. 18(1), the focus error detection signal becomes a curve represented by a solid line 353 in FIG. 18(3).

On the other hand, FIG. 18(2) shows the case where the three spots pass between the tracks 351. The reflected beam of the sub-spot 350c is not much modulated by the pit 352 and decreases down to about the half of the case of FIG. 18(1), for example. Though not shown in FIG. 18, when the deviation of the optical disk is in the opposite direction and the sub-spot 350b becomes the smallest, too, the degree of modulation of the reflected beam of the sub-spot 350b due to the pit 352 drops down to about the half of the case of FIG. 18(1), for example. Accordingly, when the three spots pass between the tracks 351 as shown in FIG. 18(2), the peak of the focus error detection signal drops down to about the half as represented by a dash line 354 in FIG. 18(3), and the detection sensitivity near the focus also decreases to about the half or below. If the detection sensitivity drops during the starting action of auto-focussing servo, driving power for causing the focussing lens to follow the error of the disk becomes insufficient and the operation of the focussing lens gets retarded. For this reason, the starting action is likely to fail. In other words, the prior art described above is not free from the problem that the starting action of auto-focussing servo is likely to be unstable.

On the other hand, in the automatic tracking control, sampling servo using pre-wobbled pits is known as a system which can automatically align the target of tracking and moreover, which does not generate theoretically any offset even when the positions of optical components deviate. The tracking error detection method in this system utilizes the occurrence of the difference in the modulation levels of the reflected beams in accordance with the tracking error when the main spot passes by two sets of pre-wobbled pits that are equidistantly deviated to the right and left from the track center, receives the reflected beams by the optical detectors and the difference of the modulation levels and obtains the track error detection signal. According to this method, the track error detection signal automatically reaches the zero level after the main spot passes through the track center. Therefore, the position adjustment of the optical components for aligning the target of tracking is not necessary. The optical detectors need only to receive the total light power of the reflected beams, and even when the fitting positions of the optical components change, no offset occurs in the track error detection signal. Generally, however, in order to reduce the size of the optical head and its production cost, the same optical system is used for focus error detection and track error detection, and the optical detection device for detecting the focus error and the optical detection device for detecting the track error are also mounted to the same optical detector package. Therefore, even though the position adjustment of the optical components for aligning the target of tracking is not necessary, high precision position adjustment of the optical components is still necessary for focussing, and the advantage of the sampling servo is not sufficiently exploited.

If a beam separation optical system for separating the disk reflected beams in the orthogonal direction by the use of a polarizing beam splitter, a half prism and a half mirror is employed, an optical path of the detection optical system ranging from the beam splitter to the optical detection is necessary separately from the focussing optical system extending from the semiconductor laser to the focussing lens. Accordingly, this system is not suitable for scale-down of the optical head.

If a direction grating or a holographic device is used for the beam separation optical system, the optical path can be used commonly for both the focussing optical system and the detection optical system by mounting the semiconductor laser and the optical detector adjacent to each other, and this system is effective for scale-down of the optical head. However, since the diffraction grating or the holographic device cannot completely separate the outgoing beams from the semiconductor laser from the reflected beam from the disk, the following problems occur. First, since the semiconductor laser outgoing beam, too, is separated into a large number of higher order diffraction beams besides the 0 order diffraction beam when it passes through the diffraction grating or the holographic device, the optical intensity of the main beam drops. To prevent the remarkable drop of the optical intensity of the main beam described above, diffraction efficiency of the higher order diffraction beams must be kept at a low level, so that separation efficiency of the disk reflected beams is low and a sufficient detection signal cannot be obtained. Still another problem is that a major proportion of the disk reflected beams return to the semiconductor laser and a laser noise is likely to occur.

JP-A-1-303632 does not sufficiently examine the drop of light power resulting from shading the luminous flux and is not free from the problem that offset may occur due to the unbalance of the light power of the reflected beams from the two sub-spots.

It is an object of the present invention to provide a compact optical head which can keep stable performance for an extended period by preventing degradation of a semiconductor laser.

It is another object of the present invention to provide a compact optical head using a focus error detection system which does not need a position adjustment of optical components for focussing, does not either generate any offset in a focus error detection signal even when the fitting positions of the optical components change, and can accomplish a stable starting action of auto-focussing servo without being affected by the deviation of an optical disk in a radiation direction, and to provide further a compact, adjustment-free optical head which uses a formated optical disk for a sampling servo system and uses the sampling servo system for tracking control.

It is another object of the present invention to provide a focus error detection system which eliminates the necessity for the position adjustment of optical components for focussing, does not generate any offset in a focus error detection signal even when the fitting positions of the optical components change, and can self-adjust the target of focussing, and to provide a focus error detection system which can be applied sufficiently to a future waveguide type optical head.

It is still another object of the present invention to provide a focus error detection system which can make self-adjustment lest any offset occurs in a focus error detection system even at the time of adjustment during assembly of an optical head.

It is still another object of the present invention to provide a compact optical head which can completely separate an outgoing beam from a semiconductor laser from reflected beams from a disk and moreover, can use commonly an optical path for both focussing optical system and detection optical system.

Problems to be Solved by the Invention

To accomplish the objects described above, in an optical head comprising a semiconductor laser, particularly a semiconductor laser chip, a focal optical system such as focussing lens for forming spots of an outgoing beam from the semiconductor laser on the surface of an information medium such as a disk, a beam separation optical system such as a diffraction grating, a beam splitter, a half mirror, etc, for separating a reflected beam from the information medium from the outgoing beam, optical detectors for receiving detection beams separated by the beam separation optical system, and an optical head body for fixing the semiconductor laser, the focusing optical system, the beam separation optical system and the optical detectors, the present invention seals the semiconductor laser by the focusing optical system or the beam separation optical system and the optical head body.

In a preferred embodiment (Embodiment 2) of the present invention, a space sealed by the focusing optical system or the beam separation optical system and the optical head body is purged by a dry nitrogen gas as a substitution gas.

In another preferred embodiment (Embodiment 3) of the present invention, a space sealed by the focusing optical system or the beam separation optical system and the optical head body is rendered vacuum.

In still another preferred embodiment (Embodiment 4) of the present invention, the focusing optical system or the beam separation optical system and the optical head body are hermetically coupled by baking.

In still another preferred embodiment (Embodiment 5) of the present invention, the position of the optical head body is controlled as a whole in two directions by a two-directional lens actuator, or the like, in accordance with a focus error detection signal and a track error detection signal.

In still another preferred embodiment (Embodiment 6) of the present invention, the beam separation optical system comprises a first beam separation optical system for separating the outgoing beam from the semiconductor laser into a main beam and two sub-beams and a second beam separation optical system for separating a plurality of reflected beams reflected by the information medium into directions different from that of the outgoing beam; the first beam separation optical system comprises a first diffraction grating or a holographic device for providing positive and negative astigmatism to the two sub-beams; marks such as corrugated pits recorded in advance for modulating the reflection light power of the sub-beams or pits having mutually different reflection factors are disposed on the surface of the information medium; and the beam separation optical system comprises a plurality of optical detectors or at least two optical detection devices such as split optical detectors for receiving respectively a +1 order sub-beam and a −1 order sub-beam separated by the second beam separation optical system, and a focus error detection circuit comprising in turn two amplitude detection circuits for detecting the magnitudes of the amplitudes modulated by the marks from the light power signals outputted by the two optical detection devices for receiving the sub-beams, and a subtraction circuit for subtracting between two amplitude detection signals outputted from the amplitude detection circuits.

In still another preferred embodiment (Embodiment 7) of the present invention, the first diffraction grating or the holographic device is the aggregate of a plurality of line grooves the grating groove pitch of which increases or decreases sequentially, and the marks are arranged in a direction perpendicular to the direction of the track.

In still another preferred embodiment (Embodiment 8) of the present invention, the first diffraction grating or the holographic device is part of the aggregate of a plurality of concentric elliptic grooves the grating groove pitch of which increases or decreases sequentially, and the center position of the concentric elliptic grooves is disposed at a position eccentric from the position of the major optical axis of a 0 order beam. The marks are arranged in a direction perpendicular to the direction of the track.

In still another preferred embodiment (Embodiment 9) of the present invention, the amplitude detection circuit comprises a first sample and hold circuit for holding the level of the output signal of the optical detection device when the +1 order beam or the −1 order beam exists between the marks, a second sample and hold circuit for holding the level of the output signal of the optical detection device when the +1 order beam or the −1 order beam exists on the marks, and a subtraction circuit for effecting subtraction between the output signal of the first sample and hold circuit and the output signal of the second sample and hold circuit.

In still another preferred embodiment (Embodiment 10) of the present invention, the amplitude detection circuit includes a built-in switch circuit for keeping always the polarity of the output signal of the amplitude detection circuit at the positive level or the negative level.

In still another preferred embodiment (Embodiment 11) of the present invention, the marks comprise a first pit group so disposed as to be spaced apart by a predetermined distance from a predetermined track center line by which the main spot is guided on the surface of the information medium, and a second pit group so disposed as to be spaced apart equidistantly from the track center line on the opposite side to the first pit group, and a track error detection signal is obtained by comparing the level of the output signal of the optical detection device when the main spot passes through the first pit with the level of the output signal of the optical detection device when the main spot passes through the second pit.

In still another preferred embodiment (Embodiment 12) of the present invention, the second beam separation optical system for separating the reflected beams reflected from the information medium in the directions different from the outgoing beam comprises a diffraction grating plate having a second diffraction grating made of a birefrigence material and formed on at least one of the surfaces thereof, and polarization-rotation means such as a Faraday rotator or a quarter wavelength plate for rotating the polarizing direction lest the reflected beam becomes an extraordinary beam (or an ordinary beam) when it passes through the second diffraction grating. The convexities and concavities of the second diffraction grating have the difference of their optical path lengths which is some multiples of the wavelength and $\frac{1}{4}$ wavelength with respect to the extraordinary beam (or the ordinary beam), and their widths are substantially equal to each other.

In still another preferred embodiment (Embodiment 13) of the present invention, the convexities and concavities of the second diffraction grating have the difference of their optical path lengths which is some multiples of the wavelength for the extraordinary beam (or the ordinary beam).

In still another preferred embodiment (Embodiment 14) of the present invention, the polarization rotation means is a quarter wavelength plate.

In still another preferred embodiment (Embodiment 15) of the present invention, the diffraction grating plate and the quarter wavelength plate have a unitary structure with each other.

In still another preferred embodiment (Embodiment 16) of the present invention, the first diffraction grating is formed on the other surface of the diffraction grating plate having the second diffraction grating.

In still another preferred embodiment (Embodiment 17) of the present invention, the first diffraction grating is made of a birefrigence material, the convexities and concavities of the first diffraction grating have the difference of their optical path lengths which is some multiples of the wavelength with respect to the extraordinary beam (or to the ordinary beam), and their widths are substantially equal to each other.

Operation

In the present invention, the semiconductor laser, particularly the semiconductor laser chip, is sealed by the focusing optical system or the beam separation optical system, and the optical head body; hence, the semiconductor laser chip is not directly exposed to external air containing a moisture and flowing in from outside the optical head body. Accordingly, unstable laser oscillation due to the degradation of the end surfaces of the semiconductor laser chip does not occur, and performance of the optical head remains stable even when it is used for an extended period or when it is preserved or used in an environment having much moisture.

In the second or third embodiment of the present invention, the semiconductor laser, particularly the semiconductor laser chip, is placed in a dry nitrogen atmosphere or in vacuum as soon as the production of the optical head is completed, and the clean end surfaces of the semiconductor laser chip can be maintained for a long time. Accordingly, the optical head can be preserved or used for a longer period.

In the fourth embodiment, a baking material having a lower melting point than the material of the optical components such as the focussing lens and the diffraction grating, e.g. cobalt glass (m.p. about 500° C.), is heated, molten and then cooled gradually to improve air-tightness of the joint portion for sealing the semiconductor laser chip. Furthermore, this method solves also the problem of degradation of the end surfaces of the semiconductor laser chip caused by an impurity gas which is emitted from an adhesive when the adhesive is used.

In the fifth embodiment, the optical head body is position-controlled in two directions as a whole by a two-directional lens actuator, etc., in accordance with the focus error detection signal and the track error detection signal, so that automatic focussing control as well as automatic tracking control can be accomplished.

In order to explain the function of the sixth embodiment, the function of the first diffraction grating and the principle of the focus error detection according to the present invention will be explained with reference to FIGS. 16 and 17. FIG. 16 is a fundamental structural view of the optical head according to the present invention. a laser beam flux 301 outgoing from a semiconductor laser 300 is separated into a 0 order beam 304a, a +1 order beam 304b and a −1 order beam 304c by a first diffraction grating 302. The +1 order beam 304b and the −1 order beam 304c outgo in directions which are different by very fine positive and negative angles from the 0 order beam 304a. Unlike an ordinary equidistant pitch line groove type diffraction grating, the first diffraction grating 302 used in the present invention is a non-equidistant pitch line groove type grating or a concentric elliptic type diffraction grating, and functions as a positive cylindrical lens or a positive troidal lens for the +1 order beam and as a negative cylindrical lens or a negative troidal lens for the −1 order beam. Accordingly, it provides the positive and negative astigmatisms having an equal absolute value to the +1 order beam and the −1 order beam. Due to the function of the first diffraction grating 302, the +1 order beam 304b is under a more convergent state at least inside the direction of the sheet of drawing than the 0 order beam 304a and the −1 order beam 304c is under a more dispersed state than the 0 order beam 304. Each of these beams is contracted by a focussing lens 306. The convergent point of the 0 order beam 304a, the convergent point of the +1 order beam 307b and the convergent point of the −1 order beam 307c are hereby called 307a, 307b and 307c, respectively, inside the direction of the plane of the sheet of drawing. However, the convergent points 307b and 307c are the focal lines of the +1 and −1 order beams 304b and 304c, respectively. The 0 order beam 304a, the +1 order beam 304b and the −1 order beam 304c due to the optical disk 308 are reflected by the optical disk 308, pass through the focussing leans 306, are separated from the outgoing beam 301 of the semiconductor laser 300 by a second diffraction grating 303 and reach optical detection devices. The optical detection device receives the +1 order reflected beam 310b and outputs a light power signal 312b, while the optical detection device 311c receives the −1 order reflected beam 310c and outputs a light power signal 312c. Marks such as concave-convex pits are disposed on the optical disk 308. When the optical disk 308 moves in a transverse direction of the plane of the sheet of drawing, the light power of the +1 order reflected beam 310b and that of the −1 order reflected beam 310c are modulated by the marks, and both the light power signals 312b and 312c are modulated, too. The degrees of modulation of the light power signals 312b and 312c can be detected by a wave envelope detection circuit, for example. This wave envelope detection circuit detects the upper and lower levels of the amplitude of an input signal and outputs their difference, that is, the degree of modulation of the input signal. Therefore, a modulation degree signal 314b represents the degree of modulation of the +1 order reflected beam 310b by the marks, while a modulation degree signal 314c represents the degree of modulation of the +1 order reflected beam 310c by the marks. These modulation degree signals 314b and 314c are inputted to a subtraction circuit 315 and its output is used as a focus error detection signal 316.

The position (target focussing position) of the optical disk 308 which is most suitable for the recording and reproduction of data by the 0 order beam 304a is the position 309 (2) of the convergent point 307a of the 0 order beam 304a. Since the astigmatisms the first diffraction grating 302 provides to the +1 order beam 304b and −1 order beam 304c have mutually opposite polarities but have the equal absolute value, the deviation distance of the convergent points 306b and 306c from the optical disk 308 is equal. Therefore, the degrees of modulation of the +1 order reflected beam 310b and −1 order reflected beam 310c by the marks are equal to each other at this position, the level of the modulation degree signal 314b is equal to the level of the modulation degree signal 314c and the focus error detection signal 316 reaches the zero level. When the optical disk 308 deviates towards the position 309 (1), the degree of modulation of the +1 order reflected beam 310b becomes great whereas the degree of modulation of the −1 order reflected beam 310c becomes small, and the focus error detection signal 316 turns to the positive level. The degree of modulation of the +1 order reflected beam 310b becomes maximal when the optical disk 308 exists at the position 309 (1) of the convergent point 307b of the +1 order beam 304b, and the focus error detection signal 316 reaches the maximum positive level. When the optical disk 308 deviates towards the position 309 (3), on the contrary, the degree of modulation of the +1 order reflected beam 310b becomes small, the degree of modulation of the −1 order reflected beam 310c becomes great, and the focus error detection signal 316 falls to the negative level. When the optical disk 308 exists at the position 309 (3) of the convergent point 307c of the −1 order beam 304c, the degree of modulation of the −1 order reflected beam 310c becomes maximal, and the focus error detection signal 316 reaches the maximum negative level.

FIGS. 17(1) and (3) show the optical disk surface when the optical disk 308 shown in FIG. 16 deviates to the position 309 (3). Reference numeral 320a denotes the main spot, 320b and 320c are the sub-spots, and 322 is the pit recorded on the track 321. The pits 322 are aligned over several tracks in the radial direction of the disk. FIG. 17(1) shows the case where three spots pass on the track 321, and the reflected beam of the sub-spot 320c is greatly modulated by a plurality of pits 322. Though not shown in the drawing, when the optical disk 308 shown in FIG. 16 deviates to the position 309 (1), the reflected beam of the sub-spot 320b is greatly modulated by a plurality of the pits 322. Accordingly, when three spots such as those shown in (1) pass on the track 321, the focus error detection signal becomes a curve such as the one represented by a solid line 323 in FIG. 17(3). The solid line 323 represents that substantially the same detection sensitivity as that of the solid line 353 in FIG. 18(3) can be obtained. FIG. 17(2) shows the case where three spots pass between the tracks 321 and in this case, too, the reflected beam of the sub-spot 320c is greatly modulated by a plurality of pits 322. Therefore, the degree of modulation is substantially the same as that of the case (1) and does not drop. Though not shown in the drawing, when the optical disk 308 shown in FIG. 16 deviates to the position 309 (1), the reflected beam of the sub-spot 320b is modulated by a plurality of pits 322 and the degree of modulation which is substantially the same as that of the case (1) can be obtained and does not drop. Therefore, when the three spots pass between the tracks 321 as in the case (2), the focus error detection signal is at substantially the same level as the solid line 323 as represented by a dash line 324 in FIG. 17(3), and the detection sensitivity at the peak and near the focal point does not decrease. Therefore, even when any track error occurs, the starting action of auto-focussing servo can be carried out stably.

According to the present invention as explained above, the astigmatisms that the first diffraction grating 302 provides to the +1 order beam 304b and the −1 order beam 304c have always an equal absolute value so long as their polarities are opposite. Therefore, if the optical disk 308 exists at the target focussing position, the deviation distance of the convergent point 307b is always equal to that of the convergent point 307c and the degree of modulation of the +1 order reflected beam 310b by the marks is always equal to that of the −1 order reflected beam 310c, so that the focus error detection signal 316 automatically reaches the zero level. According to the present invention, therefore, setting of the target focussing position can be carried out automatically and there is no need to make the position adjustment of the optical components for the purpose of focussing. In the present invention, the optical detection devices 311b and 311c need only to receive the total light power of the +1 order reflected beam 310b and the −1 order reflected beam 310c, respectively, and each of the reflected beams may exist at any position of the light reception plane of each optical detection device. Therefore, even when the positions of the optical components deviate, offset does not theoretically develop in the focus error detection signal. Even when any track error occurs, the starting action of autofocussing servo can be carried out stably.

In the seventh embodiment, the first diffraction grating 302 or the holographic device is the aggregate of a plurality of line grooves the groove pitch of which increases or decreases sequentially, provides the positive and negative astigmatisms, which converge or diverge only in one direction, to the +1 order beam and the −1 order beam, and emits the +1 order beam and the −1 order beam in the opposite directions with respect to the main optical axis of the 0 order beam. Since the marks are aligned in the direction perpendicular to the direction of the track, the drop of the focus error signal does not occur and the starting action of autofocussing servo can be carried out stably even when any track error occurs.

In the eighth embodiment, the first diffraction grating or the holographic device is part of the aggregate of a plurality of concentric elliptic grooves the groove pitch of which increases or decreases sequentially, and provides the positive and negative astigmatisms, which converge or diverge in two directions, to the +1 order beam and the −1 order beam. The center position of its concentric elliptic grooves is eccentrically deviated from the main optical axis of the 0 order beam, and the first diffraction grating or the holographic device emits the +1 order beam and the −1 order beam in the opposite directions with respect to the main optical axis of the 0 order beam. Since the marks are aligned in the direction perpendicular to the direction of the track, the drop of the focus error detection signal does not occur even when any track error occurs, and the starting action of autofocussing servo can be carried out stably.

In the ninth embodiment, the amplitude detection circuit comprises the first sample and hold circuit for holding the output signal level of the optical detection device when the +1 order beam or the −1 order beam exists between the marks, the second sample and hold circuit for holding the output signal level of the optical detection device when the +1 order beam or the −1 order beam exists on the mark, and the subtraction circuit for subtracting the output signal of the first sample and hold circuit and the output signal of the second sample and hold circuit. In this way, the magnitude of the amplitude modulated by the marks can be detected from the light power signals which are received by the optical detection devices for receiving the subbeams.

In the tenth embodiment, the amplitude detection circuit is equipped with the built-in switch circuit for keeping always the polarity of the output signal of the amplitude detection circuit at the positive or negative level. Therefore, since the amplitude signals have always the same polarity, no erroneous operation occurs in the focus error detection signal when their subtraction is carried out.

In the eleventh embodiment, the marks comprise the first pit group disposed in the spaced-apart relation by a predetermined distance from a predetermined track center line on the surface of the information medium, on which the main spot is guided, on one of the sides of the center line, and the second pit group disposed in the spaced-apart relation by the same distance from the track center line on the opposite side of the center line. The sample servo system can be employed for the tracking control by the use of an optical disk formated for the sample servo system in the same way as in the focus error detection system in the present invention by comparing the level of the output signal of the optical detection device when the main spot passes by the first pit with the level of the output signal of the optical device when the main spot passes by the second pit. In this way, a compact, adjustment-free optical disk can be accomplished.

Next, in order to explain the function of the twelfth embodiment of the present invention, the function of the beam separation optical system comprising the second diffraction grating and the polarization-rotation means will be explained. In FIG. 16, the light source such as the semiconductor laser 300 emits the linearly polarized laser beam 301. The outgoing beam 301 from the semiconductor laser passes through the second diffraction grating plate 303 made of a birefrigence material, then passes through the polarization-rotation means 305 such as the Faraday rotator or the quarter wavelength plate, and reaches the information medium such as the optical disk 308. The reflected beam reflected by the information medium 308 gain passes through the polarization-rotation means 305. The polarization-rotation device 305 such as the Faraday rotator or the quarter wavelength plate can reciprocate the laser beam and rotate by 90° the polarizing direction of the linearly polarized beam. The outgoing beam 301 from the light source 300, for example, propagates inside the second diffraction grating plate 303 as the ordinary beam, while the reflected beam from the disk 308 propagates through the second diffraction grating plate 303 as the extraordinary beam. The groove depth of the diffraction grating of the second diffraction grating plate 303 is set so that the difference of the optical path lengths between the extraordinary beam passing through the convexities and the extraordinary beam passing through the concavities becomes some multiples and ½ of the wavelength. The width of the convexities of the grating grooves and that of the concavities are substantially equal to each other. Therefore, the beam passing through the convexities and the beam passing through the concavities have the equal intensity, and offset with each other in the direction of the 0 order diffraction because their phases are deviated by the half wavelength from each other. On the other hand, since they reinforce with each other in the directions of the ±1 order diffraction, they become strong ±1 order diffraction beams, and reach the optical detectors 311$b$ and 311$c$ disposed near the semiconductor laser 300. Accordingly, the disk reflected beams can be separated completely and a sufficient detection signal can be obtained. Since the disk reflected beams do not return to the semiconductor laser 300, the occurrence of the laser noise can be reduced.

In the thirteenth embodiment, the optical disk is set so that the difference of the optical lengths of the concavities and convexities of the second diffraction grating for the ordinary beam (or for the extraordinary beam) becomes substantially some multiples of the wavelength. Therefore, the phase of the beam passing through the convexities of the second diffraction grating is in conformity with the phase of the beam passing through the concavities, and the second diffraction grating does not function as the diffraction grating for the outgoing beam 301 from the semiconductor laser. In other words, since the outgoing beam 301 from the semiconductor laser is not separated by the second diffraction grating, it is separated only by the first diffraction grating 303 and then reaches the optical disk 308. Therefore, the optical intensity of the main beam 304$a$ does not drop.

In the fourteenth embodiment, the polarization-rotation means 305 uses the quarter wavelength plate. Therefore, the optical head can be made compact and its production cost can be reduced.

In the fifteenth embodiment, the number of necessary components can be reduced by integrating the diffraction grating plate with the quarter wavelength plate. Therefore, the assembly of the optical head becomes easier and the optical head becomes more compact.

In the sixteenth embodiment, the first diffraction grating 302 is formed on the other surface of the diffraction grating plate 303. Therefore, the number of necessary optical components can be reduced and the optical head becomes more compact. Furthermore, the assembly of the optical head becomes easier.

In the seventeenth embodiment, the first diffraction grating 302 is made of a birefringence material. The convexities and concavities of the first diffraction gating 302 have the difference of their optical lengths which is substantially some multiples of the wavelength for the extraordinary beam (or for the ordinary beam), and their widths are substantially equal to each other. Therefore, the first diffraction grating 302 does not exhibit the function of the diffraction grating to the disk reflected beam. For this reason, a plurality of beams 304$a$, 304$b$ and 304$c$ after being separated from the outgoing beam of the semiconductor laser by the first diffraction grating 302 are not further separated even when they again pass through the first diffraction grating 302 after being reflected by the disk.

BRIEF DESCRIPTION OF THE DRAWINGS

FIG. 21 is a block diagram showing another example of the envelope detection circuit shown in FIG. 10.

DESCRIPTION OF THE PREFERRED EMBODIMENTS

Hereinafter, the first embodiment of the present invention will be explained with reference to FIGS. 1 to 13 and 19.

Figure 1:
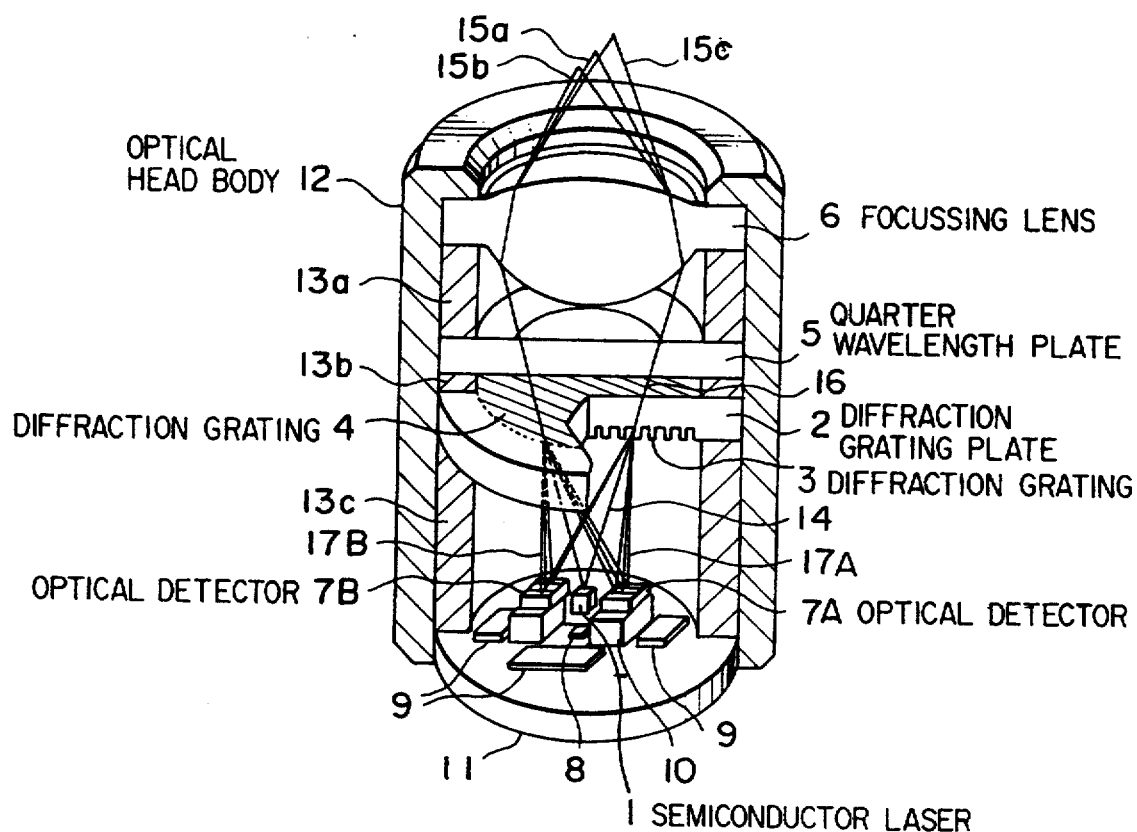
FIG. 1 is an overall structural view of an optical head according to the present invention.

FIG. 1 is a structural view of the optical head according to the present invention. Reference numeral 1 denotes a semiconductor laser, 2 is a diffraction grating plate made of a birefrigence material, 5 is a quarter wavelength plate, 6 is a focussing lens, 7A and 7B are 3-split optical detectors, 8 is an optical detector for monitoring laser power of the semiconductor laser 1, and 9 is an arithmetic circuit for an optical detector output signal. A diffraction grating 3 is disposed on the surface of the diffraction grating plate 2 on the side of the semiconductor laser 1 and another diffraction grating 4 is disposed on the surface on the side of the focussing lens 6. A beam 14 outgoing from the semiconductor laser 1 is separated by the diffraction grating 4 into a main beam 15a and sub-beams 15b, 15c. Reference numeral 16 denotes the reflected beams which are generated when the main beam 15a and the sub-beams 15b, 15c are reflected by an optical disk, not shown in FIG. 1, and pass through the quarter wavelength plate. The reflected beam 16 is separated by the diffraction grating 3 into beams 17A and 17B. Each of the reflected beams 16, 17A, 17B comprises the main beam 15a and the sub-beams 15b, 15c. The beam 17A is received by the 3-split optical detector 7A and the beam 17B, by the 3-split optical detector 7B. The semiconductor laser 1 and the optical detectors 7A, 7B are fixed onto a round substrate 11 through a flange 10. The optical detector 8 for monitoring light power and an accumulated electric circuit 9 are also fixed onto the round substrate 11. Reference numeral 12 denotes a cylindrical optical head body, and the focussing lens 6, the quarter wavelength plate 5, the diffraction grating plate 2 and the round substrate 11 are fixed inside this optical head body 12 through spacers 13a, 13b and 13c.

Figure 19A:
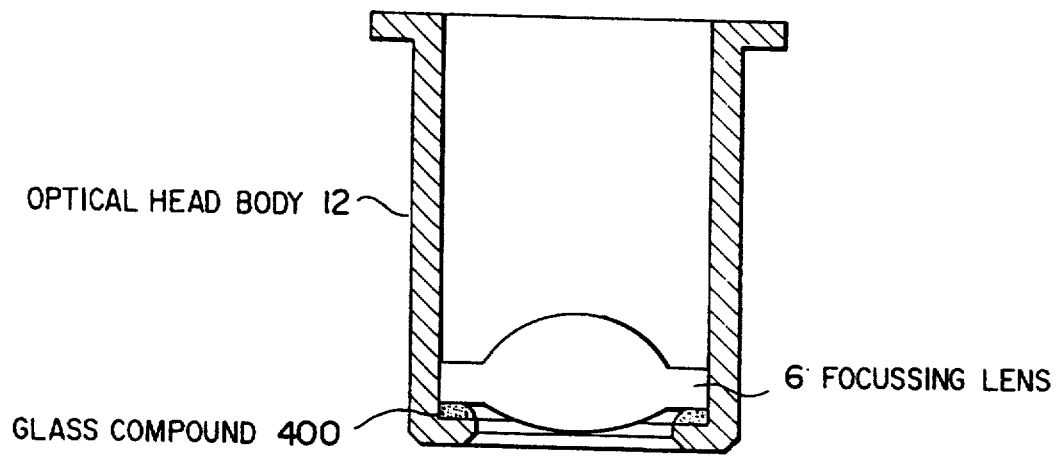
FIG. 19(a)–19(b) is an assembly view of the optical head of the present invention.
Figure 19B:
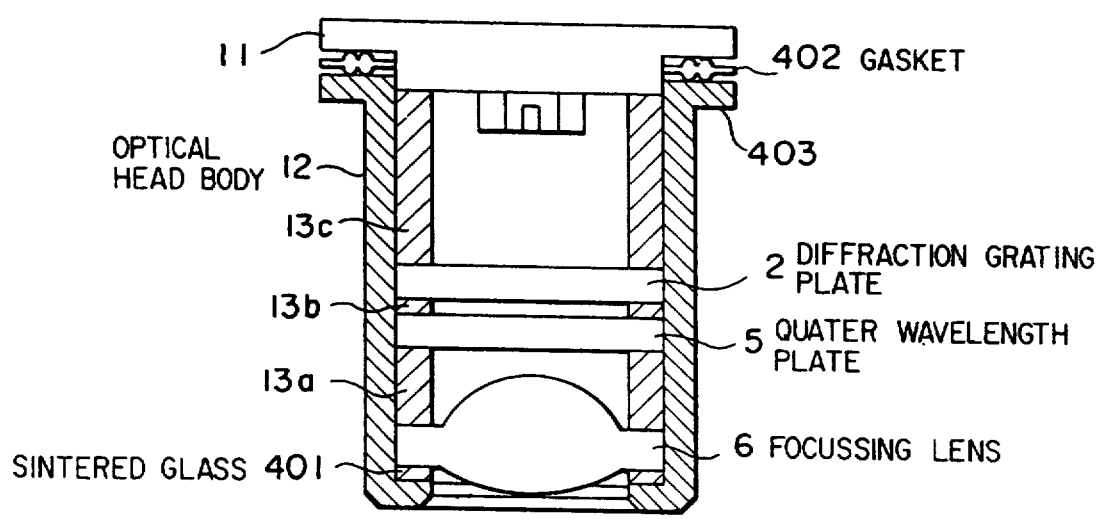

FIG. 19 shows the assembly view of this head. First of all, glass powder 400 having a low melting point such as cobalt glass is sandwiched between the optical head body 12 and the focussing lens 6 as shown in FIG. 19(a) and is heated by an oven. Cobalt glass is molten at about 500° C., for example. When the temperature is gradually lowered to the room temperature, the molten glass having a low melting point is solidified as shown in FIG. 19(b) and turns to baked glass 401, which seals and bonds the optical head body 12 and the focussing lens to each other. After the focussing lens 6 is bonded by baking to the optical head body 12, the spacer 13a, the quarter wavelength plate 5, the spacer 13b, the diffraction grating plate 2 and the spacer 13c are inserted into the optical head body 12 in the order named inside a dry nitrogen atmosphere. Thereafter, a ring-like packing 402 made of a soft metal such as copper is placed on a flange portion 403 of the optical head body 12, and after the round substrate 11 is covered, the convex portion of the metal packing 402 is crushed by the flange portion 403 and the round substrate 11 using a screw not shown in the drawing, and the round substrate 11 is thus fixed. The step described above fills the inside of the optical head body 12 by the dry nitrogen gas and is sealed from external air.

Figure 2:
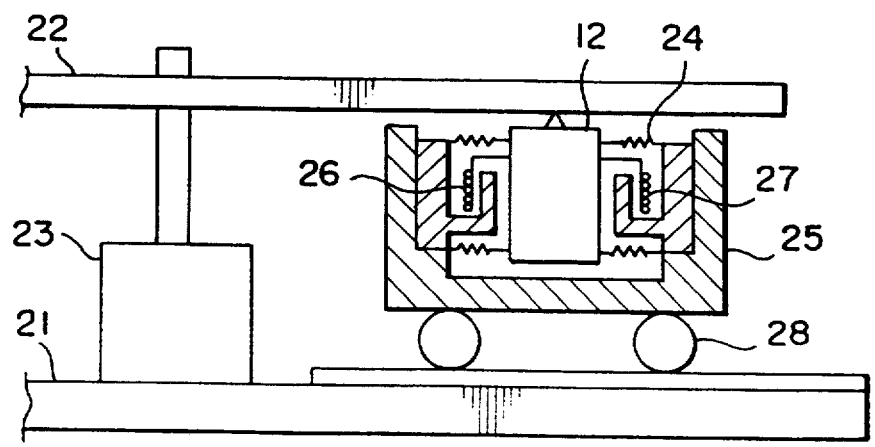
FIG. 2 is a structural view of a mechanical system of an optical disk apparatus according to the present invention.

FIG. 2 is a structural view of the mechanical system of the optical disk apparatus using the optical head shown in FIG. 1. Reference numeral 21 denotes a substrate of the apparatus, 22 is the optical disk and 23 is a motor for rotating the optical disk 22. The optical disk body 12 is fitted to a two-directional optical head actuator 25 through a spring 24. The two-dimensional optical head actuator 25 comprises a focussing actuator comprising a coil and a magnet, for moving the optical head body 12 a whole in the vertical direction with respect to the sheet of the drawing and effecting a focussing control, and a tracking actuator 27 comprising a coil and a magnet, for moving the optical head body 12 as a whole to the right and left with respect to the sheet of the drawing and effecting a tracking control. A carriage 28 moves the two-dimensional optical head actuator 25 as a whole in the radial direction of the optical disk 22 and makes an access control.

Figure 3:
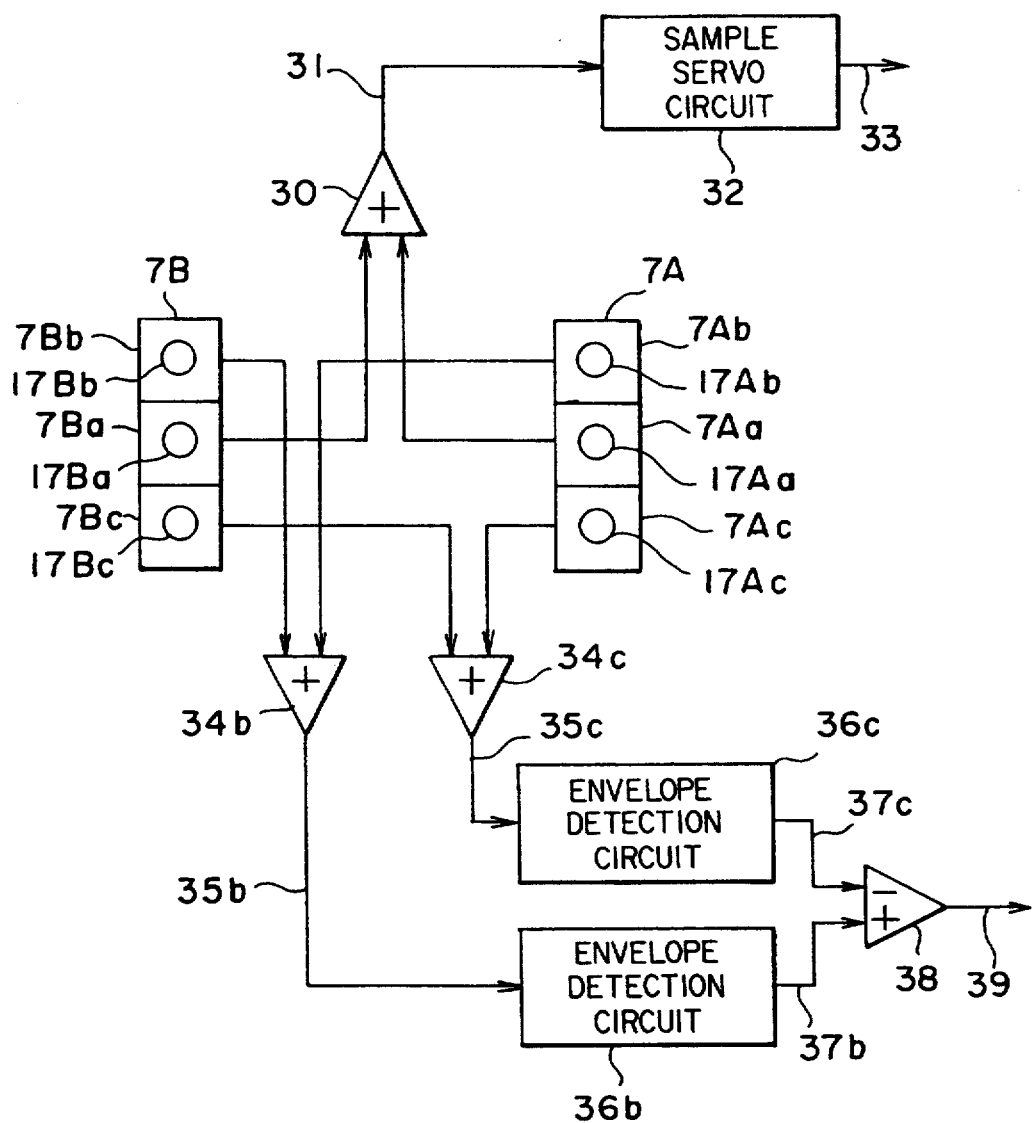
FIG. 3 is a partial circuit diagram of an optical detection portion of the present invention.
Figure 4A:
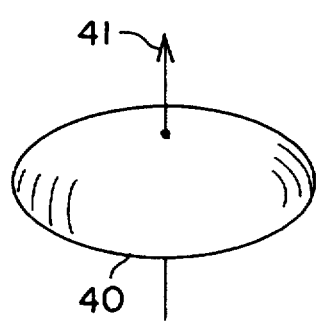
FIG. 4($a$)–4($d$) is a structural view of a diffracting grating plate in the present invention.
Figure 4B:
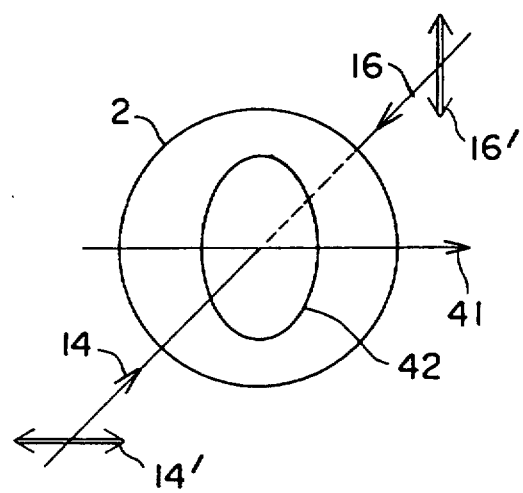
Figure 4C:
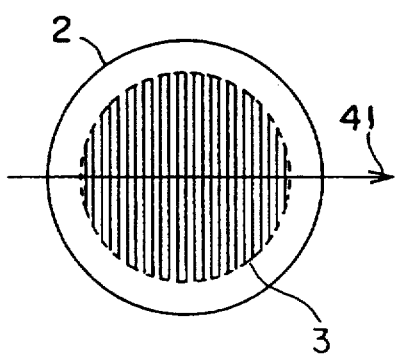
Figure 4D:
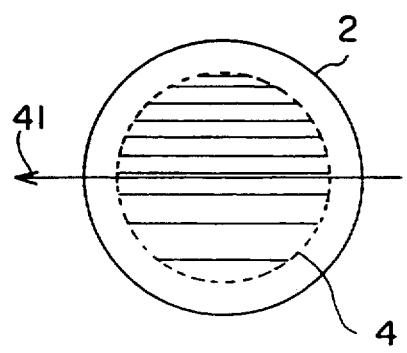

FIG. 3 shows a structure of the 3-split optical detectors 7A and 7B and is also a block diagram of the arithmetic circuit 9. The 3-split optical detector 7A comprises three light reception devices 7Aa, 7Ab and 7Ac. The light reception device 7Aa receives the main beam 17Aa of the beam 17A, the light reception device 7Ab receives the sub-beam 17Ab of the beam 17A and the light reception device 7Ac receives the sub-beam 17Ac of the beam 17A. The 3-split optical detector 7B comprises three light reception devices 7Ba, 7Bb and 7Bc. The light reception device 7Ba receives the main beam 17Ba of the beam 17B, the light reception device 7Bb receives the sub-beam 17Bb of the sub-beam 17B and the light reception device 7Bc receives the sub-beam 17Bc of the beam 17B. An addition circuit 30 adds the output signal of the light reception device 7Aa to that of the light reception device 7Ba and outputs a light power signal 31 of the main beam 15a. A sample servo circuit 32 generates a track error detection signal 33 from the light power signal 31 of the main beam 15a. The track error detection signal 33 is supplied to the tracking actuator 27 shown in FIG. 2 so as to make the tracking control. An addition circuit 34b adds the output signal of the light reception device 7Ab to that of the light reception device 7Bb and outputs a light power signal 35b of the sub-beam 15b. An envelope detection circuit 36b generates a modulation degree signal 37b from the light power signal 35b of the sub-beam 15b. An addition circuit 34c adds the output signal of the light reception device 7Ac to that of the light reception device 7Bc and outputs a light power signal 35c of the sub-beam 15c. An envelope detection circuit 36c generates a modulation degree signal 37c from the light power signal 35c of the subbeam 15c. A subtraction circuit 38 makes subtraction between the modulation degree signal 37b and the modulation degree signal 37c and outputs a focus error detection signal. The focus error detection signal 39 is supplied to the focussing actuator 26 shown in FIG. 2 and makes the focussing control.

Next, the operation of the beam separation optical system according to the present invention will be explained.

FIG. 4 is an explanatory view useful for explaining the structure of the diffraction grating plate 2. The diffraction grating plate 2 is made of LiNbO₃(lithium niobate), for example. FIG. 4(a) shows an indicatrix 40. LiNbO₃ is a crystal of the trigonal system and is an optically uniaxial crystal. Therefore, its indicatrix 40 is an elliptic which is flat and has symmetry of rotation in the optical axis direction (or the C axis of the crystal axis) 41. FIG. 3(b) shows the diffraction grating plate 2, the optical axis 41 of LiNbO₃ and the polarizing directions of the beams 14 and 16. The optical axis 41 lies in the plane of the diffraction grating plate 20 The cut sectional shape of the indicatrix 40 perpendicular to the beam 14 or 16 is an ellipse the minor axis of which extends in the optical axis direction 41 as represented by an ellipse 42. The polarizing direction 14' of the outgoing beam 14 of the semiconductor laser 1 is in conformity with the direction of the optical axis 41. Therefore, the outgoing beam 14 propagates as the extraordinary beam inside the diffraction grating plate 2. The beam 14 passing through the diffraction grating plate 2 is converted to a circularly polarized beam by the quarter wavelength plate 5, is reflected and converted to a circularly polarized beam having a reverse round by the optical disk 22, passes once again through the quarter wavelength plate 5, and becomes a linearly polarized beam in the direction perpendicular to the polarizing direction 14' of the outgoing beam 14. Therefore, the polarizing direction 16' of the disk reflected beam 16 is in conformity with the direction of the major axis of the ellipse 42, and the disk reflected beam 16 propagates as the ordinary beam inside the diffraction grating 2. The equidistant pitch line groove type diffraction grating 3 such as the one shown in FIG. 4(c) is disposed on the surface of the diffraction grating plate 2 on the side of the semiconductor laser, and the groove depth of this diffraction grating 3 is 4.63 μm, for example. The non-equidistant pitch line groove type diffraction grating 4 such as the one shown in FIG. 4(d) is disposed on the surface of the diffraction grating plate 2 on the side of the focussing lens, and the groove depth of this diffraction grating 4 is 1.85 μm, for example.

Figure 5:
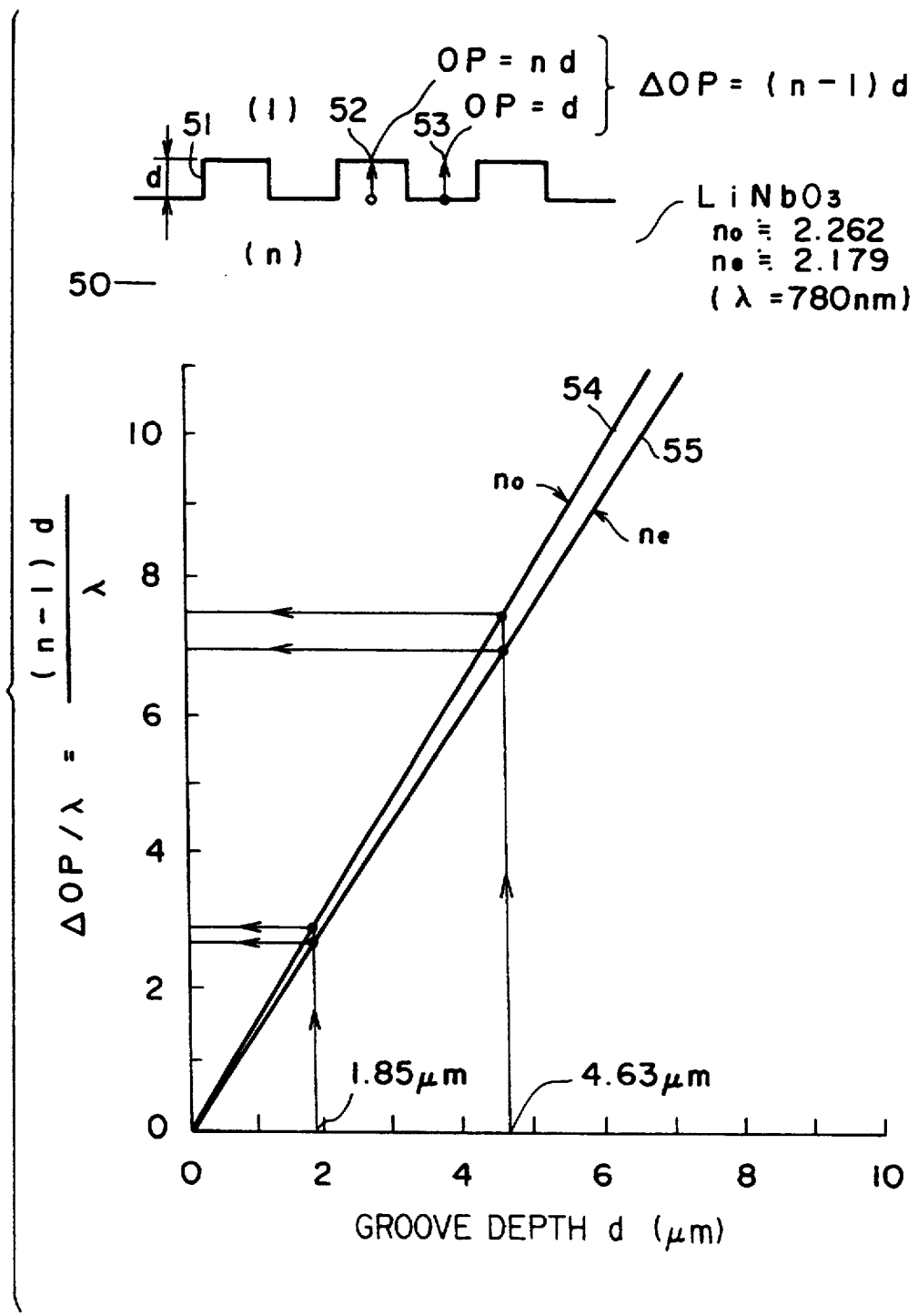
FIG. 5 is an explanatory view of a partial structure of the diffraction grating plate in the present invention.

FIG. 5 is a diagram which is useful for explaining why the groove depths are different between the two diffraction gratings 3 and 4. As shown at the upper stage of FIG. 5, if the groove depth of the diffraction grating 51 made of a material 50 having a refraction index n is d, the optical path length 52 of convexities is nd. If the diffraction grating is surrounded by air, the difference AOP of the optical lengths between the convexity and concavity is given by the following equation because the optical path length 53 of the concavity is d:

$$\Delta OP = (n-1)d$$

If ΔOP is some multiples of the wavelength, there is no deviation between the phase of the beam passing through the convexity and the phase of the beam passing through the concavity, and no action of the diffraction grating exists. When ΔOP deviates from some multiples of the wavelength, the phase of the beam passing through the convexity deviates from the phase of the beam passing through the concavity, and the action of the diffraction grating appears. Particularly when ΔOP is some multiples of the wavelength and the half wavelength, the phase of the beam passing through the convexity deviates by 180° from the phase of the beam passing through the concavity, and the beams outgoing in the 0 order diffraction direction offset each other, so that the 0 order diffraction beam does not occur. Accordingly, the passing beams are mainly diffracted in the ±1 order diffraction direction. In the graph at the lower stage of FIG. 5, the abscissa represents the groove depth d and the ordinate does the difference of the optical path lengths in the wavelength unit, i.e. $\Delta OP/\lambda = (n-1)d/\lambda$. The ordinary beam refractive index $n_o$ and extraordinary beam refractive index $n_e$ of LiNbO₃ near a wavelength 780 nm are given as follows:

$$n_o = 2.262$$

$$n_e = 2.179$$

The $\Delta OP/\lambda$ value obtained from the ordinary beam refractive index $n_o$ is represented by a line 54 and the $\Delta OP/\lambda$ value obtained from the extraordinary beam refractive index $n_e$ is represented by a line 55. As described above, if the value of the ordinate is exactly the half of an integer, the 0 order diffraction beam does not exist, and the diffraction grating functions as the one that generates strong ±1 order diffraction beams. As to other values, the 0 order diffraction beam becomes stronger as the values are closer to an integer, and the ±1 order diffraction beams become stronger as the values are closer to the half of an integer. It can be seen from the graph of FIG. 5 that when the groove depth is 4.63 μm, the difference of the optical path lengths is exactly seven times the wavelength for the extraordinary beam and is 7.5 times for the ordinary beam. Accordingly, when the groove depth of the diffraction grating 4 on the surface of the diffraction grating plate 2 on the semiconductor laser side is set to 4.63 μm, the diffraction grating 4 does not exhibit the function of the diffraction grating for the semiconductor laser outgoing beam 14, but generates only the ±1 order diffraction beams for the ±1 order diffraction beams for the disk reflected beam 16 without the 0 order diffraction beam. In other words, the semiconductor laser outgoing beam 14 and the disk reflected beam 16 can be separated completely by the diffraction grating 3 and the quarter wavelength plate 5. When the groove depth is 1.85 μm, the difference of the optical path lengths is exactly three times the wavelength for the ordinary beam and is 2.8 times the wavelength for the extraordinary beam. Therefore, if the groove depth of the diffraction grating 4 of the diffraction grating plate 2 on the focussing lens side is 1.85 μm, the diffraction grating 4 functions as a diffraction grating which generates a strong 0 order diffraction beam and weak ±1 order diffraction beams for the semiconductor laser outgoing beam 14 but does not exhibit the function of the diffraction grating for the disk reflected beam 16. In other words, the diffraction grating 4 can be used as a diffraction grating for generating the main beam for recording and reproduction and two sub-beams for spot position control from the semiconductor laser outgoing beam 14. Moreover, there is the advantage that even when these beams pass once again through the diffraction grating 4 after being reflected by the optical disk, they are not separated into a greater number of beams as is the case with the ordinary diffraction grating.

As can be understood from the explanation given above, the outgoing beam 14 from the semiconductor laser outgoing beam 14 is separated into the main beam 15a and the sub-beams 15b, 15c by the diffraction grating 4, and these beams pass through the quarter wave plate and reach the optical disk 22 (shown in FIG. 2). The main beam 15a and the sub-beams 15b, 15c reflected by the optical disk 22 pass through the quarter wavelength plate, and are turned to the beams 17A and the beam 17B by the diffraction grating 3. Accordingly, they can be completely separated from the semiconductor laser outgoing beam 14.

Next, the focus error detection method and the focussing control in the optical head of this embodiment will be explained.

Figure 6:
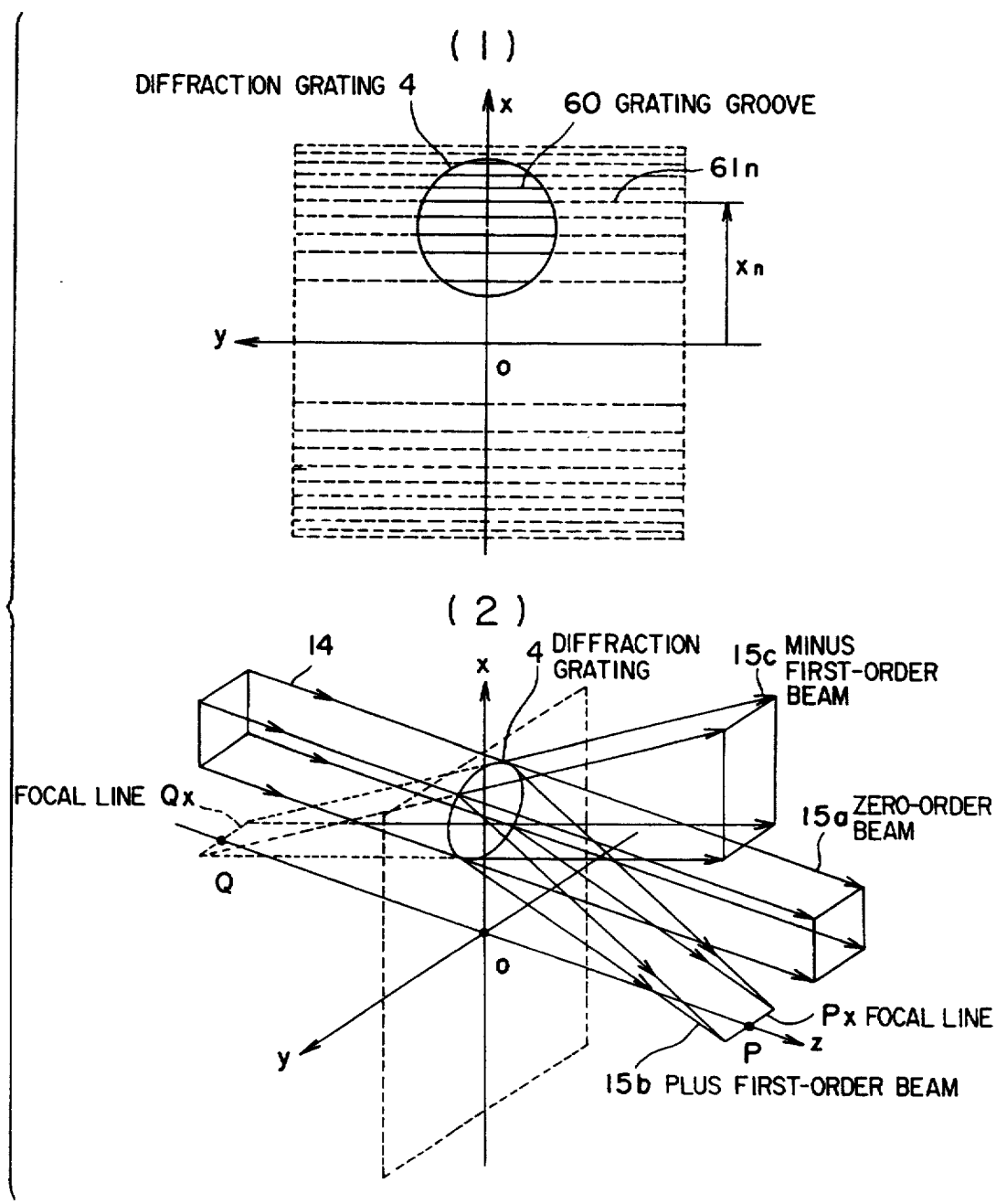
FIG. 6 is an explanatory view of a non-equidistant pitch line groove type diffraction grating and is an explanatory view of the operation of the non-equidistant pitch line groove type diffraction grating.

FIG. 6 is a diagram useful for explaining the structure and operation of the non-equidistant pitch line groove type diffraction grating 4. X and Y axes are plotted inside a plane containing the diffraction grating 4, and the traveling direction of the beam is plotted in a Z axis. Symbol O represents the origin of the coordinates of design. FIG. 6(1) shows the X - Y plane. A large number of grating grooves 60 of the diffraction grating 4 are part of a group of lines 61n (n=±1, ±2, ±3, ...) which are in parallel with the Y axis. Since the operation of the diffraction grating 4 is uniform in the Y-axis direction, its converging and diverging operation will be explained with reference to the X - Z section shown in FIG. 6(2). A point on the Z axis spaced apart by f from the origin 0 is represented by P and a circle having its center at the point P and a radius f is represented by So. A wavelength is λ, and a circle having its center at the point P and a radius (f+nλ) is represented by Sn (n=1, 2, 3, ...). If the points of intersection between the circle Sn and the X axis are the group of lines 61n, the beams, that are incident into the X - Y plane, are diffracted by the group of lines 61n, and then converge at the point P, have the same phase and strengthen one another at the point P. Therefore, they become a +1 order diffraction beam 15b. At the same time, the beams that are diffracted by the group of lines 61n in the opposite direction to the +1 order diffraction beams become the −1 order diffraction beams 15c diverging from a point Q spaced apart by a distance −f from the origin 0 due to symmetry of the diffraction angle by the diffraction grating. Therefore, when the position Xn (n = 1, 2, 3, ...) of the group of lines 61n shown in FIG. 6(1) from the origin 0 is expressed as follows, $$X_n = \sqrt{\{(f + n\lambda)^2 - f^2\}}$$

such a non-equidistant pitch line groove type diffraction grating functions as a positive cylindrical lens having a focal length f with respect to the +1 order beam 15 and provides a positive astigmatism to it as shown in FIG. 6(2), and the +1 order beam 15b converges on the focal line Px. It functions as a negative cylindrical lens having a focal length −f to the −1 order diffraction beam and provides a negative astigmatism to it, and the −1 order beam 15c becomes a beam diverging from the focal line Qx.

Figure 7:
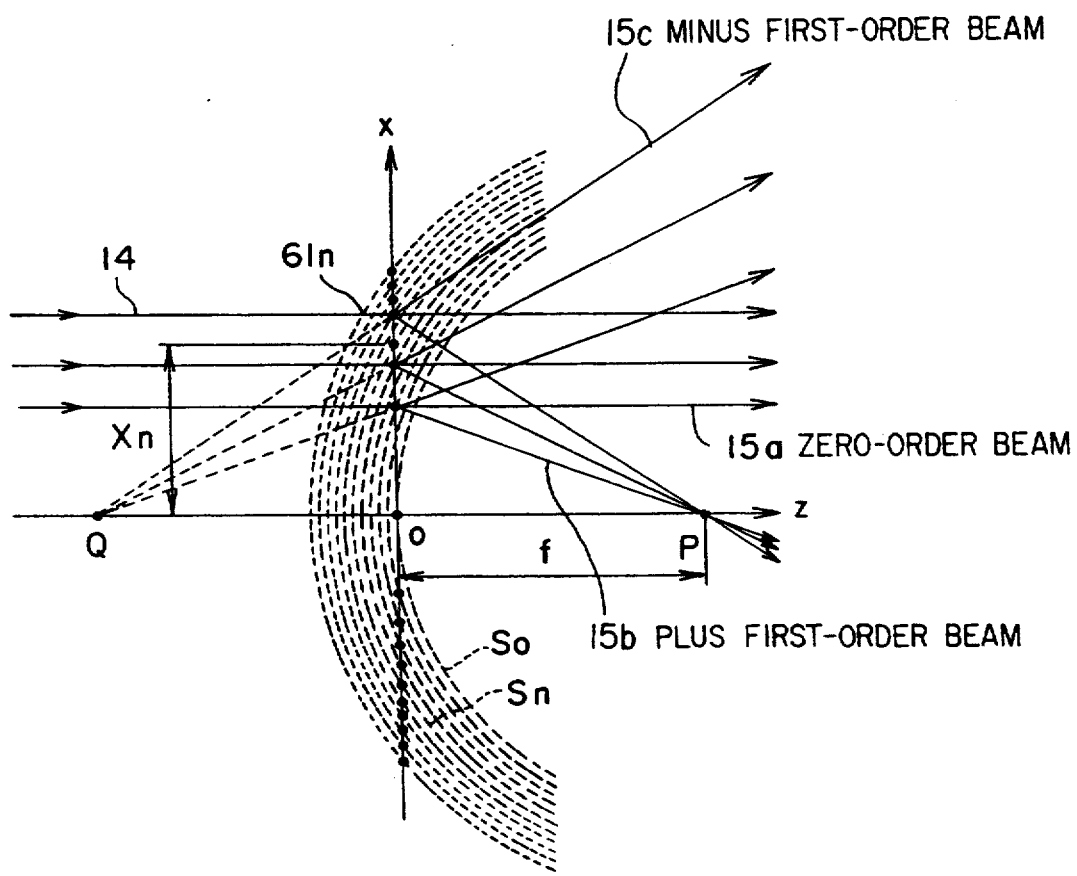
FIG. 7 is an explanatory view of the principle of the non-equidistant pitch line groove type diffraction grating.

The position Xn of the nth grating groove from the origin is given as follows, as can be seen clearly from FIG. 7:

$$X_n = \sqrt{\{(f + n\lambda)^2 - f^2\}}$$

Therefore, the focal length f=3,000 mm and the wavelength λ=0.00078 mm (780 nm) are substituted for the equation given above, and an arbitrary Xn can be determined. On the other hand, if the diffraction angle of the +1 order beam is θ=0.745°, the center position of the diffraction grating is f x tanθ=39.0 mm and hence, the range of Xn is 39.5≦Xn≦41.5 mm in consideration of the size of the diffraction grating, i.e., 5 mm. The Xn values obtained within this range are tabulated in Table 1.

TABLE 1

| n | Xn (mm) | Xn (mm) |
|---|---------|---------|
| 368 | 41.50087 | 0.05643 |
| 367 | 41.44444 | 0.05650 |
| 366 | 41.38794 | 0.05658 |
| 365 | 41.33136 | |
| ... | ... | ... |
| 327 | 39.12065 | |
| 326 | 39.06078 | 0.05987 |
| 325 | 39.00082 | 0.05996 |
| 324 | 38.94077 | 0.06005 |
| 323 | 38.88063 | 0.06014 |
| ... | ... | ... |
| 287 | 36.64983 | |
| 286 | 36.58592 | 0.06391 |
| 285 | 36.52190 | 0.06402 |
| 284 | 36.45777 | 0.06413 |

ΔXn represents the grating groove gap, is 60.0 μm at the center position and becomes sequentially smaller from 64.1 μm to 56.4 μm away from the origin 0.

The diffraction grating 4 can be produced by preparing a mask pattern of the grating grooves from the data of Table 1 using an electron beam plotter, sensitizing a photoresist on a glass substrate by an exposing device through the mask pattern and developing it. The group of lines 61n can be regarded as interference fringes generated when the incident beams 14 and the beams converging on the focal line Px or the beams diverging from the focal line Qx interfere with one another. Therefore, the diffraction grating 24 can be produced, too, by the production method of a hologram. In other words, it can be produced by placing a sensitive plate for a hologram on the X - Y plane in FIG. 6(2), and causing the beams which are directly incident into the sensitive plate in the same way as the incident beams 14 to interfere with the beams converging on the focal line Px in the same way as the +1 order beams 15b, or causing the beams which are directly incident into the sensitive plate in the same way as the incident beams 14 to interfere with the beams diverging from the focal line Qx in the same way as the −1 order beams 15c.

Figure 8:
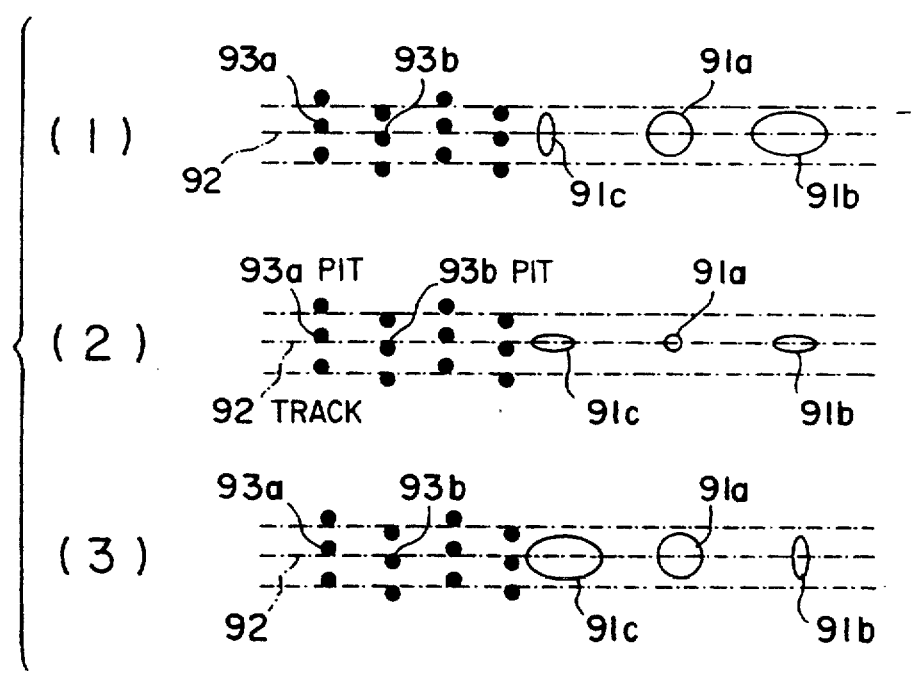
FIG. 8 is a schematic view showing the relation between the surface of an information recording medium and spots by the non-equidistant pitch line groove type diffraction grating.

FIG. 8 shows the surface of the information recording film of the optical disk 22. One round of a data region of the optical disk is divided into 32 sectors, for example, and one sector is divided into 43 segments. Concave-convex pits 93a and 93b are disposed on a track 92 represented by one-dot-chain line at the leading part of each segment. The positions of the pits 93a and 93b are aligned within at least several tracks along the radial direction of the disk (in the vertical direction to the sheet of drawing). The gap between the tracks 92 is 1.5 μm, the pit 93a is deviated by about a quarter track pitch to the upper part of the sheet of drawing and the pit 93b is deviated by about a quarter to the lower part. Reference numeral 91a denotes the spot of the main beam 15a of the 0 order diffraction. 91b is the spot of the sub-beam 15b of the +1 order diffraction and 91c is the spot of the sub-beam 15c of the −1 order diffraction. When the pits 93a and 93b pass by the spots 91a, 91b and 91c, the reflected light power of each of the main beam 16a, the sub-beam 16b and the sub-beam 16c is modulated. FIG. 8(2) shows the case where the optical disk 22 exists at the focal point of the main beam 15a, where the spot 91a is the smallest and it is the disk position most suitable for recording and reproduction of the information (target focussing position). The direction in which the diffraction grating 4 operates, is the direction of the track 92. The sub-beams 15b and 15c convert most greatly in the direction perpendicular to the track but do not converge in the track direction. Accordingly, the spots 91b and 91c become the spots which have the same size and are elongated in the track direction, and the degrees of modulation of the sub-beams 16b and 16c by the pits 93a and 93b become equal to each other. FIG. 8(1) shows the case where the optical disk 22 exists at the position of the focal line of the subbeam 15c by the −1 order diffraction. In this case, the spot 91c becomes a longitudinally elongated focal line. Since each of the pits 93a and 93b is aligned in the radial direction of the disk (in the vertical direction of the sheet of drawing), the sub-beam 16c is most greatly modulated. The spot 91b becomes further greater in the transverse direction than in the case (2) and the degree of modulation of the sub-beam 16b is smaller than in the case of (2). On the contrary, FIG. 8(3) shows the case where the optical disk 22 exists at the position of the focal line of the +1 order diffraction sub-beam 15b. The spot 91b becomes a longitudinally elongated focal line and the sub-beam 16b is modulated most greatly. The spot 91c becomes further greater in the transverse direction than in the case of (2), and the degree of modulation of the sub-beam 16c becomes smaller than in the case of (2).

Figure 9:
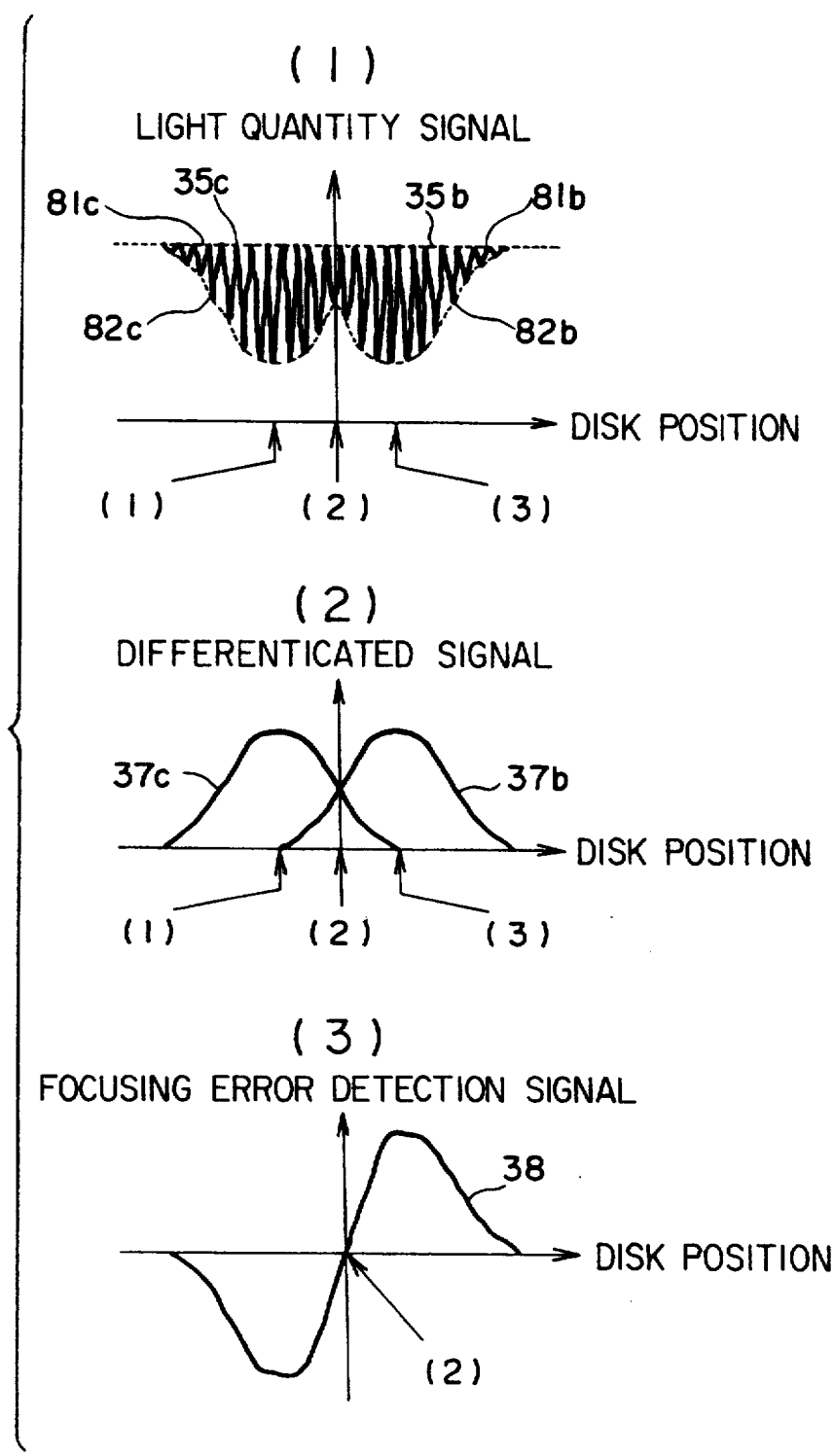
FIG. 9 is a diagram showing the state of a light power signal in the present invention and is a diagram showing the state of a modulation signal in the present invention and is a diagram showing the state of a focus error signal in the present invention.

FIG. 9(1) shows the changes of the degrees of modulation of the light power signals 35b and 35c by the pits 93a and 93b when the change of the position of the optical disk is plotted on the abscissa. (1) on the abscissa represents the position of the focal line of the −1 order diffraction sub-beam 15c, (2) represents the focal point of the main beam 15c which is the target focussing position, and (3) is the position of the focal line of the +1 order diffraction sub-beam 15b. When the disk exists at the position (1), the sub-beam 15c is modulated most greatly. Therefore, the amplitude of the light power signal 35c becomes maximal. When the optical disk exists at the position (3), the sub-beam 15b is modulated most greatly, so that the amplitude of the light power signal 35b becomes maximal. When the optical disk exists at the position (2), the amplitude of the light power signal 35b is equal to that of the light power signal 35c and drops to about the half of the maximum amplitude. These light power signals 35b and 35c are inputted to the envelope detection circuits 36b and 36b shown in FIG. 3. The envelope detection circuit 36b detects the upper and lower levels 81b, 82b of the amplitude of the light power signal 35b shown in FIG. 8(1) and outputs their difference, that is, the modulation degree signal 37b of the light power signal 35b. The envelope detection circuit 36c detects the upper and lower levels 81c, 82c of the amplitude of the light power signal 35c shown in FIG. 8(1), and outputs their difference, that is, the modulation degree signal 37c of the light power signal 35c. FIG. 8(2) shows the modulation degree signals 37b and 37c obtained by the envelope detection circuits. The modulation degree signal 37c becomes maximal at the disk position (1) while the modulation degree signal 37b becomes maximal at the disk position (3). The modulation degree signals 37b and 37c become about the half of the maximum values at the target focussing position. Therefore, when the modulation degree signals 37b and 37c are inputted to the subtraction circuit 38, the focus error signal 39 represented by a solid line in FIG. 8(3) can be obtained. When the optical disk 22 exists at the target focussing position (2), the amplitude signal 39 of the focus error detection signal automatically reaches the zero level. Accordingly, the focussing control can be effected by moving the optical head as a whole in the direction perpendicular to the plane of the optical disk 22 by the focussing actuator 26 of the two-directional optical head actuator 25 using the focus error detection signal 39.

Figure 10:
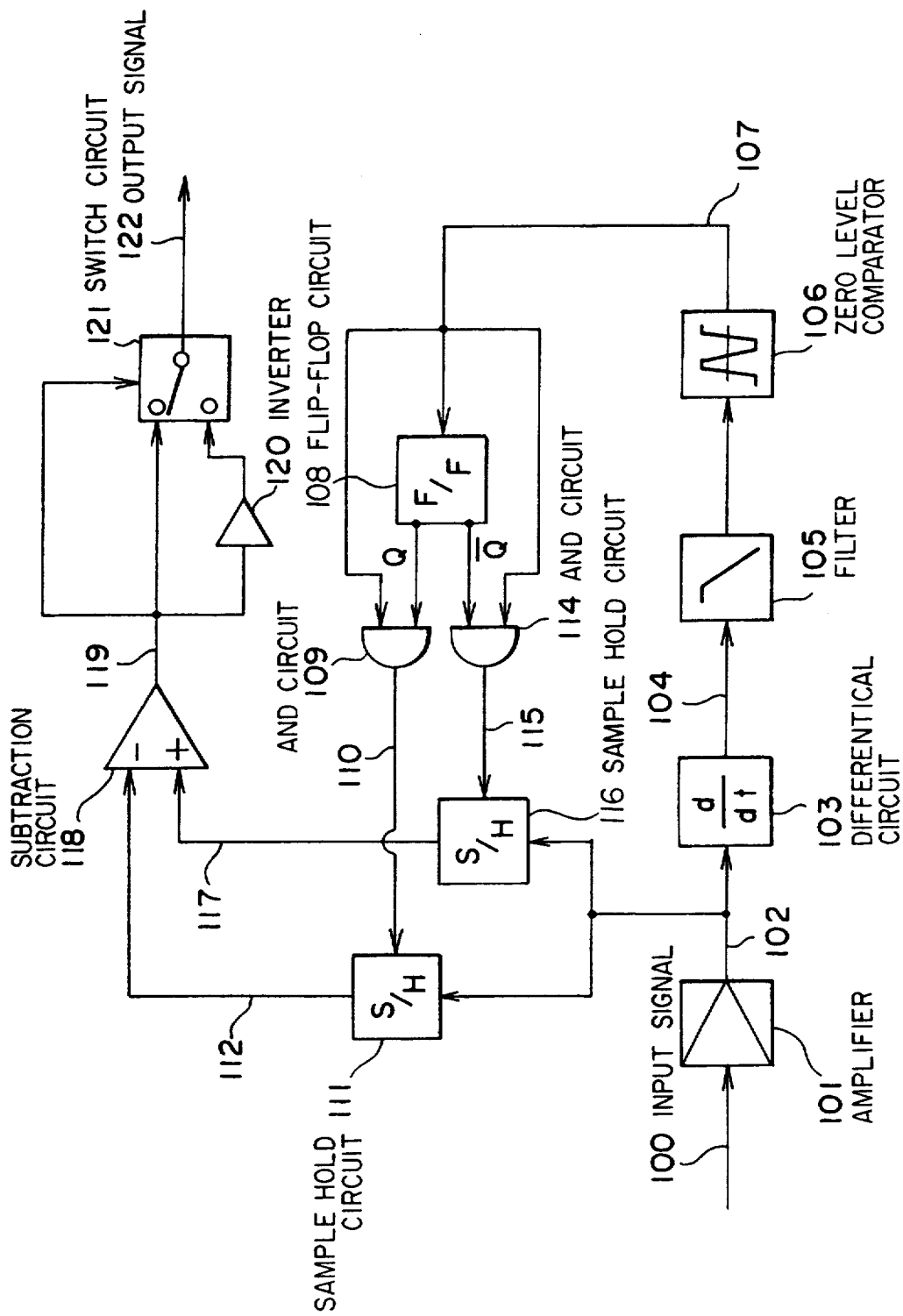
FIG. 10 is a block diagram showing an envelope detection circuit in the present invention.
Figure 11:
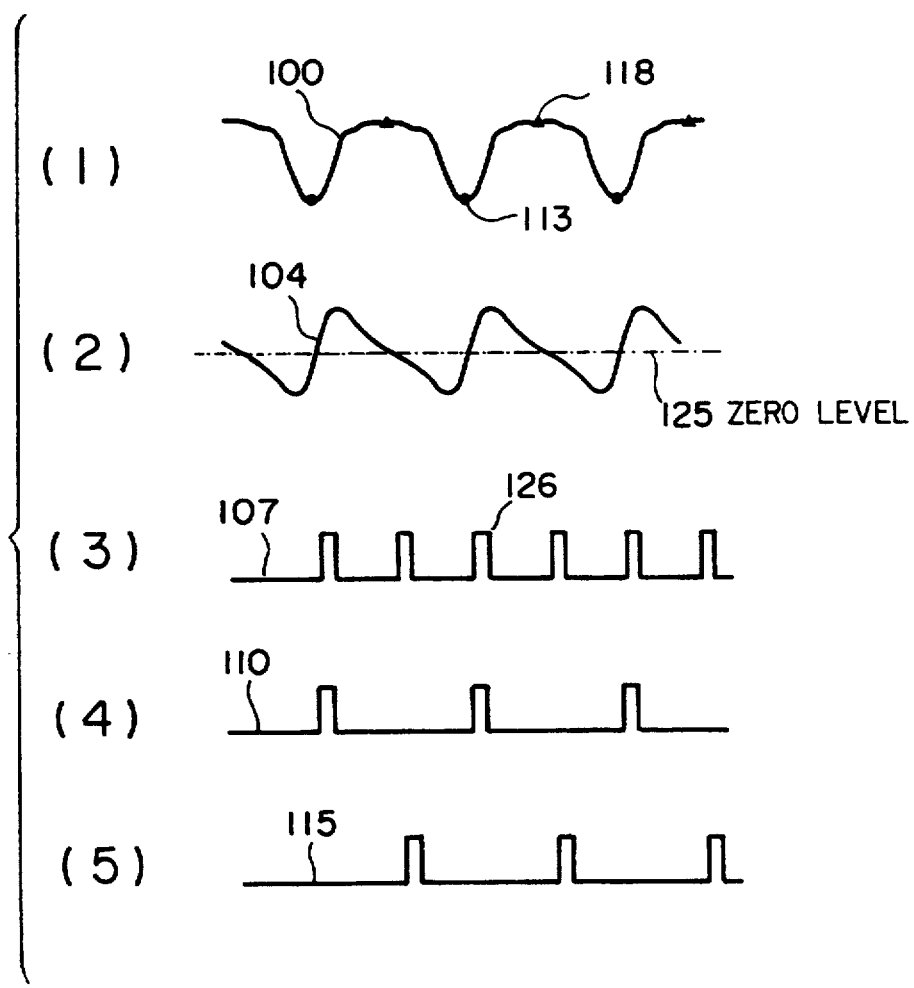
FIG. 11 is a signal waveform diagram showing the operation of the envelope detection circuit in the present invention.

FIG. 10 shows an example of the block diagram that constitutes the envelope detection circuits 36b and 36c. An input signal 100 is amplified by an amplifier 101 and is differentiated by a differential circuit 103. After a high range noise of the differential signal 104 is removed by a filter 105, it is inputted to a zero comparator 106 having both polarities to obtain a pulse signal 107. FIG. 11(1) shows an example of the input signal 100, FIG. 11(2) shows its differential signal 104 and FIG. 11(3) shows the pulse signal 107. FIG. 11 shows as a whole the passage of the same time in the rightward direction in the sheet of drawing. When the input signal 100 reaches the minimum value or the maximum value, the differential signal 104 reaches the zero level as represented by a one-dot-chain line 125, and whenever the differential signal 104 passes by the zero level, the zero level comparator 106 outputs the pulse 126. The pulse signal 107 is inputted to a flip-flop circuit 108 and whenever the pulse 126 is applied to the flip-flop circuit 108, its Q terminal repeats the high level state and the low level state. Therefore, if the Q terminal output and the pulse signal 107 are applied to an AND circuit 109, pulse signals 110 interposing each pulse between them can be obtained as shown in FIG. 11(4). If a sample timing is calculated from the pulse signal 110 by the use of a sample and hold circuit 111, the sample and hold circuit 111 outputs a level signal 112 holding the lower level of the amplitude represented by a round point 113 in FIG. 11(1). On the other hand, the $\overline{Q}$ terminal of the flip-flop circuit 108 repeats the high level state and the low level state that are opposite to those of the Q terminal. Accordingly, when the $\overline{Q}$ terminal output and the pulse signal 107 are inputted to an AND circuit 114, pulse signals 115 interposing each pulse between them and opposite to the pulse signals 110 can be obtained as shown in FIG. 11(5). Accordingly, when the sample timing of the amplifier output 102 is calculated from the pulse signals 115 by the use of a sample and hold circuit 116, the sample and hold circuit 116 outputs a level signal 117 holding the upper level of the amplitude represented by a triangular point in FIG. 11(1). When these level signals 117 and 112 are inputted to a subtraction circuit 118, there can be obtained an amplitude signal 119 in accordance with the magnitude of the amplitude of the input signal 100. However, there is the case where the level signal 117 holds the upper level of the amplitude of the input signal 100 and the level signal 117 holds its lower level and the amplitude signal becomes negative, depending on the timing of the pulse signals 110 and 115. Therefore, when the amplitude signal 119 is inputted to the A terminal and the amplitude signal 119 is inputted to the B terminal through an inverter 120 and further, when the amplitude signal 119 is inputted to the control terminal, by the use of a switch circuit 121 which selects the A terminal when the control signal is at the positive level and the B terminal when the control signal is at the negative level, then, there can be obtained an output signal 122 which always represents the magnitude of the amplitude by the positive value.

On the other hand, when a difference exists between the level signals 112 and 117 at the time of the head adjustment, the circuit structure shown in FIG. 21 is employed. In other words, gain variable circuits 125 and 126 which adjust the level signals 112 and 117 to the equal level are disposed. Depending on the timing of the pulse signals 110 and 115, there is the case where the level signal 112 holds the upper level of the amplitude of the input signal 100 and the level signal 117 holds the lower level of the amplitude, and the amplitude signal becomes negative. Therefore, the level signal 117 and the amplitude signal 112 are inputted to the A and B terminals of the switch circuit 120, respectively. If the amplitude signal 119 is positive, the A terminal is connected to the A' terminal so as to output the signal 122 and the B terminal is connected to the B' terminal so as to output the signal 121, and if the amplitude signal 119 is negative, the A terminal is connected to the B' terminal so as to output the signal 122 while the B terminal is connected to the A' terminal so as to output the signal 121. When the signals 121 and 122 are inputted to a division circuit 123 and the signal 122 is divided by the signal 121, there can be obtained an output signal 124 representing relatively the difference of the upper and lower levels even when the input signal 100 of 36$b$ and 36$c$ drops due to other reasons than the focus error, such as the kick of the part of the luminous flux, the differences of transmission and reflection factors of the optical components, and so forth.

In ordinary optical disk apparatuses, a response frequency necessary for an automatic focussing control is about 2 KHz. On the other hand, the number of segments in which the pits 93$a$ and 93$b$ are disposed is $32 \times 43 = 1,376$ per round. Assuming that the number of revolution of the optical disk 30 is 2,400 rpm (40 Hz), the sampling frequency of the focus error detection signal is about 55 KHz. Therefore, this embodiment can accomplish a sufficiently stable automatic focussing control. According to the focus error detection system of this embodiment, each of the light reception devices 7A$b$, 7A$c$, 7B$b$, 7B$c$ of the 3-split optial detectors 7A, 7B needs only to receive the total light power of each subbeam 17A$b$, 17A$c$, 17B$b$, 17B$c$, and the target point of focussing can be self-adjusted without the position adjustment of the optical detectors. Furthermore, no offset occurs in the focus error detection signal even when the fitting position of the optical detection device, etc, changes.

Next, the tracking control will be explained with reference to FIGS. 12 and 13.

Figure 12:
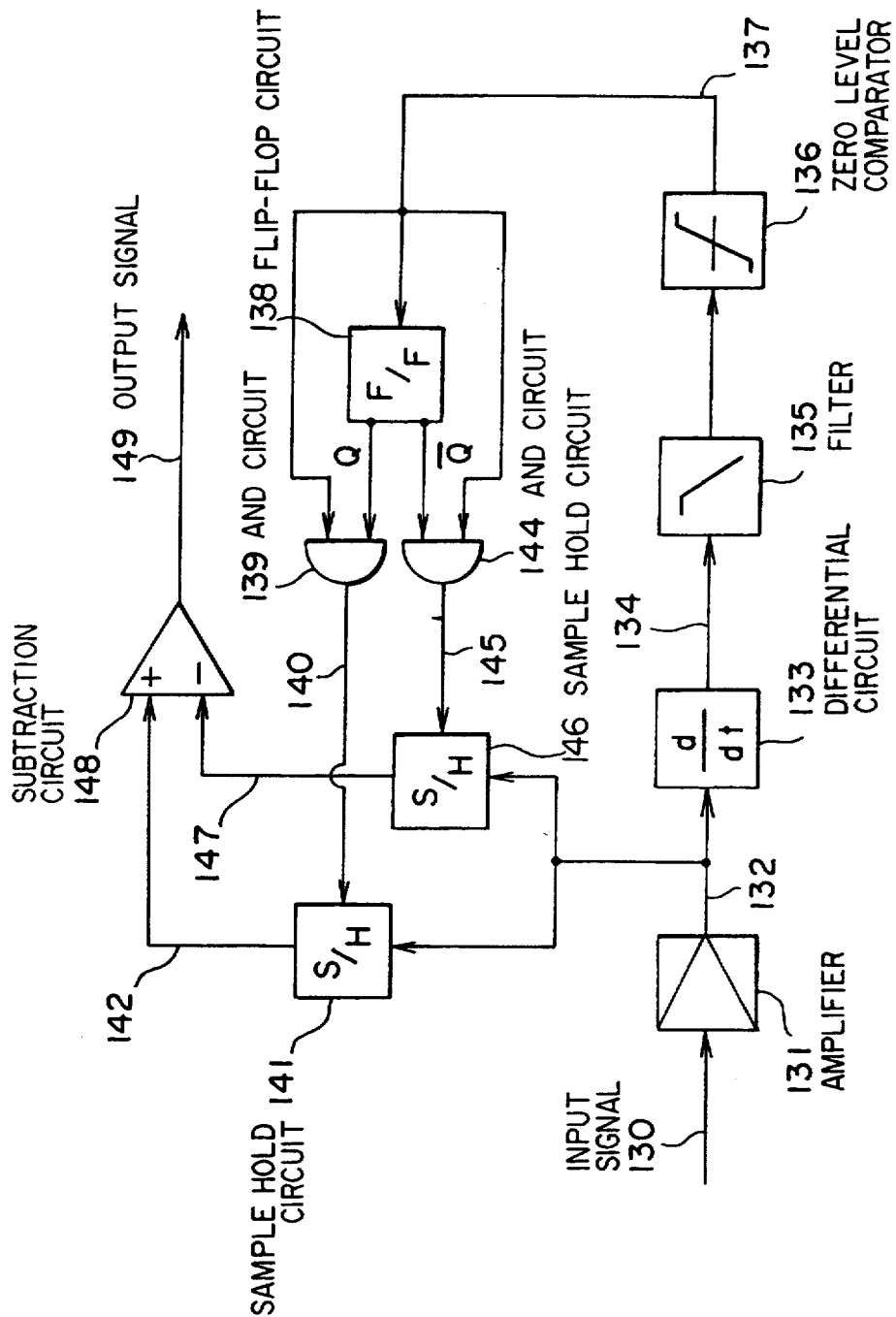
FIG. 12 is a block diagram showing a sampling servo circuit in the present invention.
Figure 13:
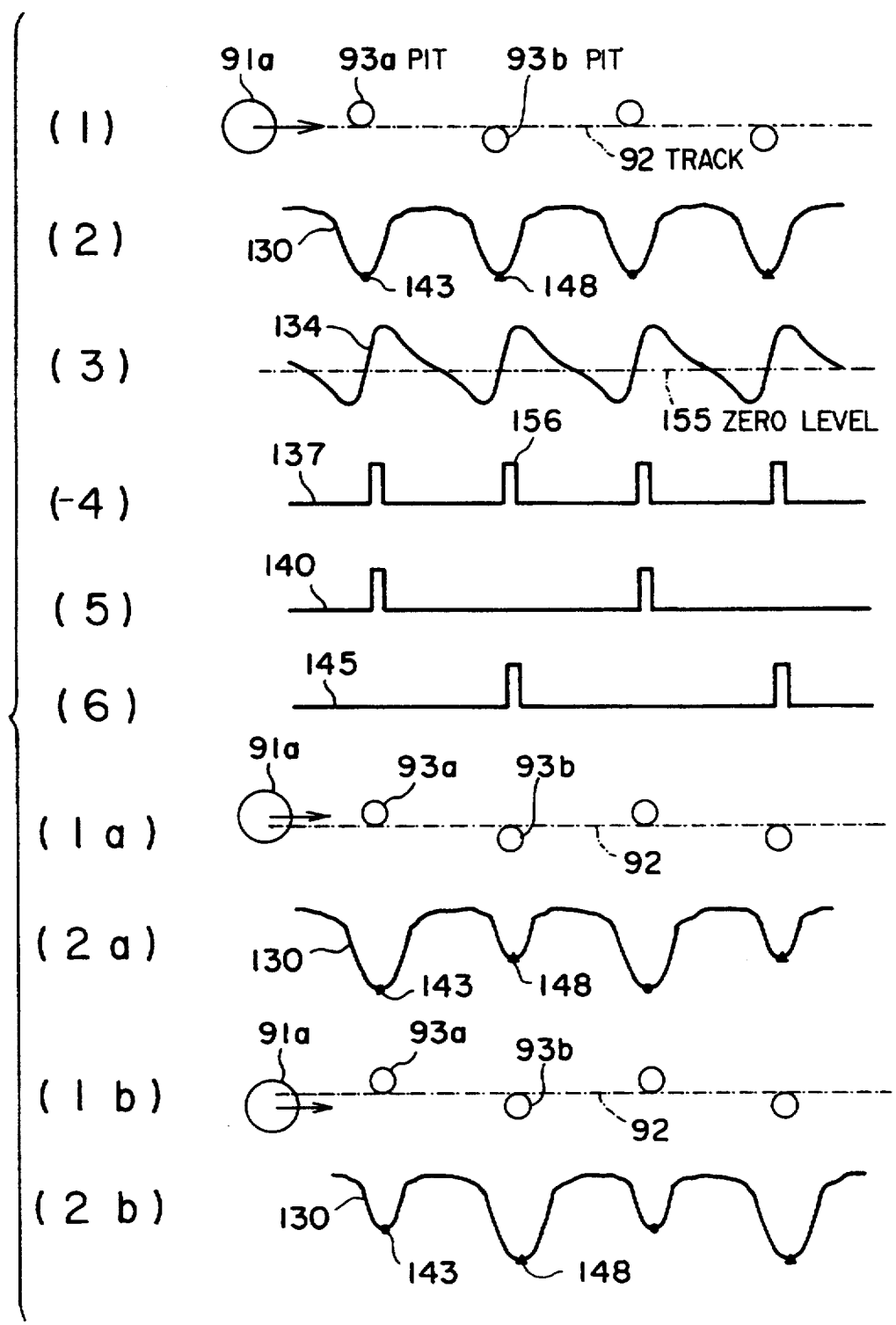
FIG. 13 is a signal waveform diagram showing the operation of the sample servo circuit in the present invention.

FIG. 12 is a block diagram of the sample servo circuit 32 shown in FIG. 3. The input signal 130 is amplified by the amplifier 131 and is differentiated by the differential circuit 133. After the high range noise of the differential signal 134 is removed by the filter 135, the signal is inputted to a rise zero comparator 136 so as to obtain a pulse signal 137. FIG. 13(1) shows the portion on the surface of the same optical disk 22 shown in FIG. 8(2), particularly the portion relating to the tracking control. Reference numeral 91$a$ denotes the spot of the main beam 15$a$, 92 is the track center, 93$a$ is the pit disposed in such a manner as to deviate by a quarter track to the upper part of the drawing and 93$b$ is the pit disposed in such a manner as to deviate by a quarter track to the lower part of the drawing. The drawing shows the case where the spot 91$a$ moves to the right of the drawing immediately above the track center 92 (the target point of the tracking control). FIG. 13(2) shows an example of the input signal 130, (3) shows its differential signal 134 and (4) shows the pulse signal 137. FIG. 13 shows the passage of the same time to the right of the drawing as a whole. When the input signal 130 is the minimum or maximum value, the differential signal 134 reaches the zero level represented by one-dot-chain line 155, and whenever the differential signal 134 passes through the zero level 155 from the negative level to the positive level, the rise zero level comparator 136 outputs a pulse 156. The pulse signal 137 is inputted to the flip-flop circuit 138 and whenever the pulse 156 is inputted to the flip-flop circuit 138, its Q terminal repeats the high level state and the low level state. Accordingly, when the Q terminal output and the pulse signal 137 are inputted to the AND circuit 139, there can be obtained the pulse signals 140 interposing each pulse as shown in FIG. 13(5). Therefore, when the sample timing of the amplifier output 132 is calculated from the pulse signals 140 by the use of the sample and hold circuit 141, the sample and hold circuit 141 outputs a level signal 142 which holds the modulation level by the pit 93$a$ represented by a round point 143 shown in FIG. 13(2).

On the other hand, the $\bar{Q}$ terminal of the flip-flop circuit 138 repeats the high and low level states opposite to those of the Q terminal. Accordingly, when the $\bar{Q}$ terminal output and the pulse signal 137 are inputted to an AND circuit 144, pulse signals 145 interposing each pulse between them and opposite to the pulse signals 140 can be obtained as shown in FIG. 13(6). When the sample timing of the amplifier output 132 is calculated from the pulse signals 145 by the use of a sample and hold circuit 146, the sample and hold circuit 46 provides a level signal 147 holding the modulation level by the pit 93$b$ represented by a triangular point 148 shown in FIG. 13(2). Therefore, the level signals 147 and 142 are inputted to a subtraction circuit 148 and its output signal 149 is used as the track error detection signal. Since the pits 93$a$ and 93$b$ are so disposed as to be deviated by the same distance from the center of the track 92, the modulation level 143 by the pit 93$a$ and the modulation level 148 by the pit 93$b$ become equal to each other when the spot 91$a$ moves immediately above the track 92 (the target point of the tracking control) as shown in FIG. 13(1), and the track error detection signal 149 reaches automatically the zero level. When the spot 91$a$ deviates to the upper part of the sheet of drawing as shown in FIG. 13(1$a$), the degree of modulation by the pit 93$a$ becomes greater and the modulation level 143 becomes lower, whereas modulation by the pit 93$b$ is not much great and the modulation level 148 becomes a higher level. Accordingly, the track error detection signal 149 changes to the negative level. When the spot 91$a$ deviates to the lower part of the sheet of drawing as shown in FIG. 13(1$b$), on the contrary, modulation is not much great by the pit 93$a$ and the modulation level 143 becomes a higher level as shown in FIG. 13(2$b$), whereas modulation becomes greater by the pit 93$b$ and the modulation level 148 becomes lower. Therefore, the track error detection signal 149 changes to the positive level. In this manner, the tracking control can be carried out by moving the optical head as a whole in the radial direction of the disk by the tracking actuator 27 of the two-directional optical head actuator 25 by the use of the track error detection signal 33.

In ordinary optical disk apparatuses, a response frequency necessary for the tracking control system is about 8 KHz. On the other hand, the sampling frequency of the track error detection signal is about 55 KHz in the same way as the focus error detection signal. According to this embodiment, therefore, a sufficiently stable automatic tracking control can be accomplished. In the track error detection system of this embodiment, each of the light reception optical devices 7A$a$ and 7B$a$ of the 3-split optical detectors 7A, 7B needs only to receive the total light power of the main beam 17A$a$, 17B$a$, and the target point of tracking can be self-adjusted without the position adjustment of the optical detectors, etc. Even when the fitting positions of the optical detection devices, etc, change, no offset occurs in the track error detection signal.

Recording and reproduction of the information can be carried out in the same way as in the ordinary optical disk apparatuses. As an example, the case using a write-once type optical disk will be explained. When the information is recorded, a pulse-like driving current is caused to flow through the semiconductor laser 1 in match with the information so as to modulate the intensity of the laser beam in the pulse-like form, and the information is recorded by thermally boring a hole in the recording film of the optical disk 22 by the use of the spot 91$a$ of the main beam 15$a$. When the information is reproduced, the semiconductor laser 1 is allowed to emit the beam by a predetermined low power. Since the reflected beam power of the reflected beams 17A$a$ and 17B$a$ of the spots 91$a$ are modulated by the information recorded as the holes, the information can be reproduced from the light power signal 31 by the use of the main beam 15$a$. When a phase-variable optical disk is used, the information is recorded not as the hole shape but as the change of the reflection factor and only with this exception, the optical head of this invention can be as such used.

The second embodiment of the present invention will be explained with reference to FIGS. 14 and 15. The second embodiment uses a concentric elliptical diffraction grating 201 shown in FIG. 14(1) in place of the non-equidistant pitch line groove type diffraction grating 4 used in the first embodiment and shown in FIG. 6(1). Since the other components and the operation are exactly the same as those of the first embodiment, their explanation will be omitted.

Figure 14:
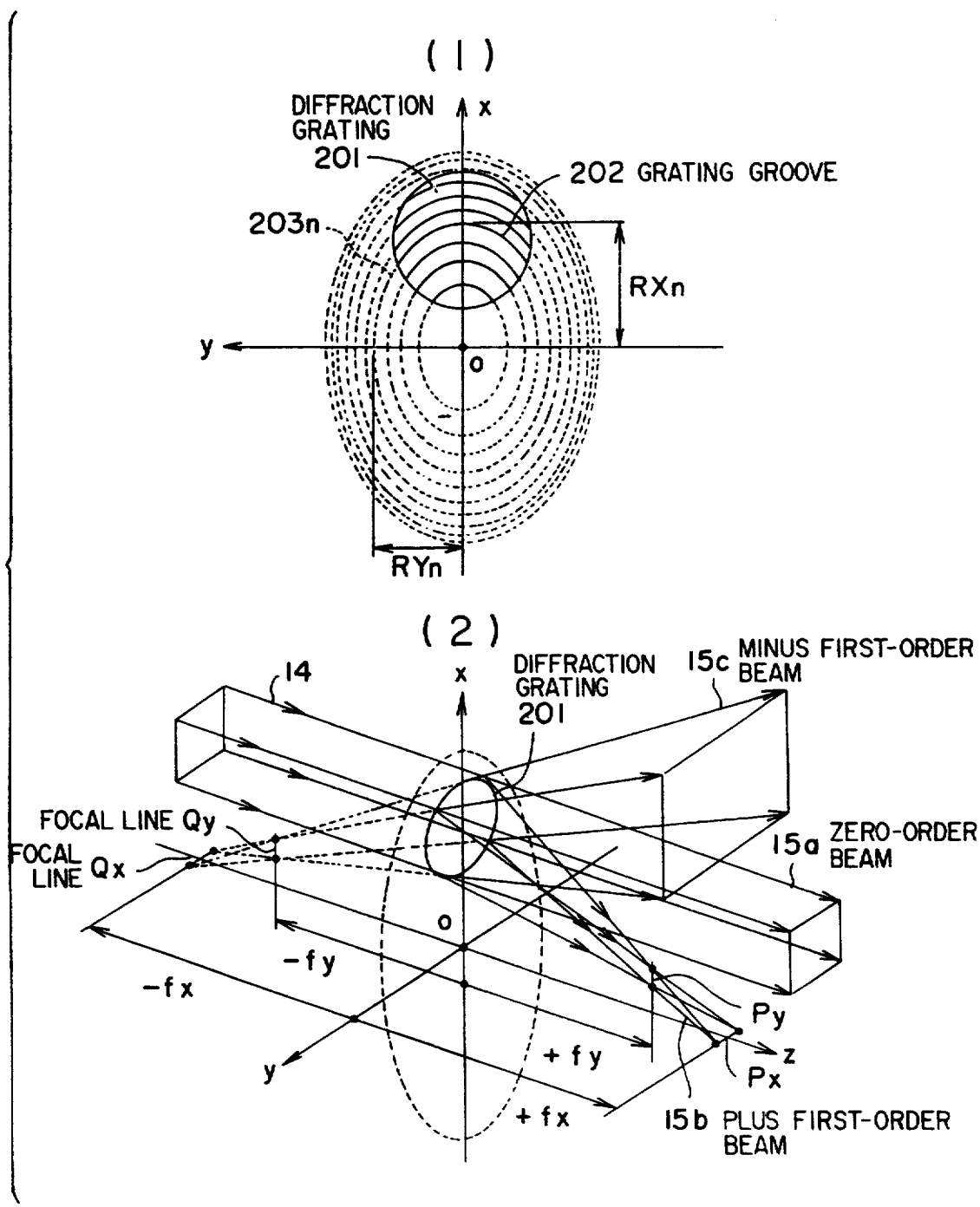
FIG. 14 is a structural explanatory view of a concentric elliptic diffraction grating and is an explanatory view of the operation of the concentric elliptic diffraction grating.

The grating grooves 202 of the concentric elliptic diffraction grating 201 are part (concentric arcs) of the concentric ellipses 203$n$ (n = 1, 2, 3 . . . ) having their center at the origin 0 as represented by dash lines in FIG. 14(1). The X axis is plotted in the direction of the major axis of the ellipses 203$n$ inside the plane containing the diffraction grating 201 and the Y axis is plotted in the direction of the minor axis. The Z axis is plotted in the traveling direction of the beam and the origin of the coordinates is set to 0. The radius RXn (n = 1, 2, 3, . . . ) of the ellipse 203$n$ in the direction of the major axis is expressed as follows:

$$RXn = \sqrt{\{(fx + n\lambda)^2 - fx^2\}}$$

The radius RYn (n = 1, 2, 3, . . . ) of the ellipse 203$n$ in the direction of the minor axis is expressed as follows:

$$RYn = \sqrt{\{(fy + n\lambda)^2 - fy^2\}}$$

(with the proviso that fy < fx). Then, as explained already with reference to FIG. 7, the +1 order diffraction beam 15$b$ converges on the point on the Z axis spaced apart by the distance fx from the origin 0 while the −1 order diffraction beams 15$c$ diverge as if they left the point on the Z axis spaced apart by the distance −fx from the origin 0 inside the X - Z plane. In the Y - Z plane, on the other hand, the +1 order diffraction beams 15$b$ converge on the point on the Z axis spaced apart by the distance fy from the origin 0 whereas the −1 order diffraction beams 15$c$ diverge as if they left the point on the Z axis spaced apart by the distance −fy from the origin 0. Accordingly, as shown in FIG. 14(2), the +1 order beams connect the focal line Px in the X direction and the focal line Py in the Y direction whereas the −1 order beams 15$c$ diverge as if they left the focal line Qx, in the X direction and diverge as if they left the focal line Qy, in the Y direction. Therefore, such a concentric elliptic diffraction grating 201 functions as a positive troidal lens having the focal line distances of fx and fy for the +1 order diffraction beams, and as a negative troidal lens having the focal line distances -fx and -fy for the −1 order diffraction beams. In consequence, the concentric elliptic diffraction grating 201 provides two-direction astigmatisms having an equal absolute value in the positive and negative directions (which astigmatism are stronger in the direction of the minor axis and weaker in the direction of the major axis of the ellipse) to the ±1 order diffraction beams 15$b$, 15$c$, and emits the +1 order beams 15$b$ and the −1 order beams 15$c$ in the positive and negative directions different at very fine angles from the 0 order beams 15$a$.

Figure 15:
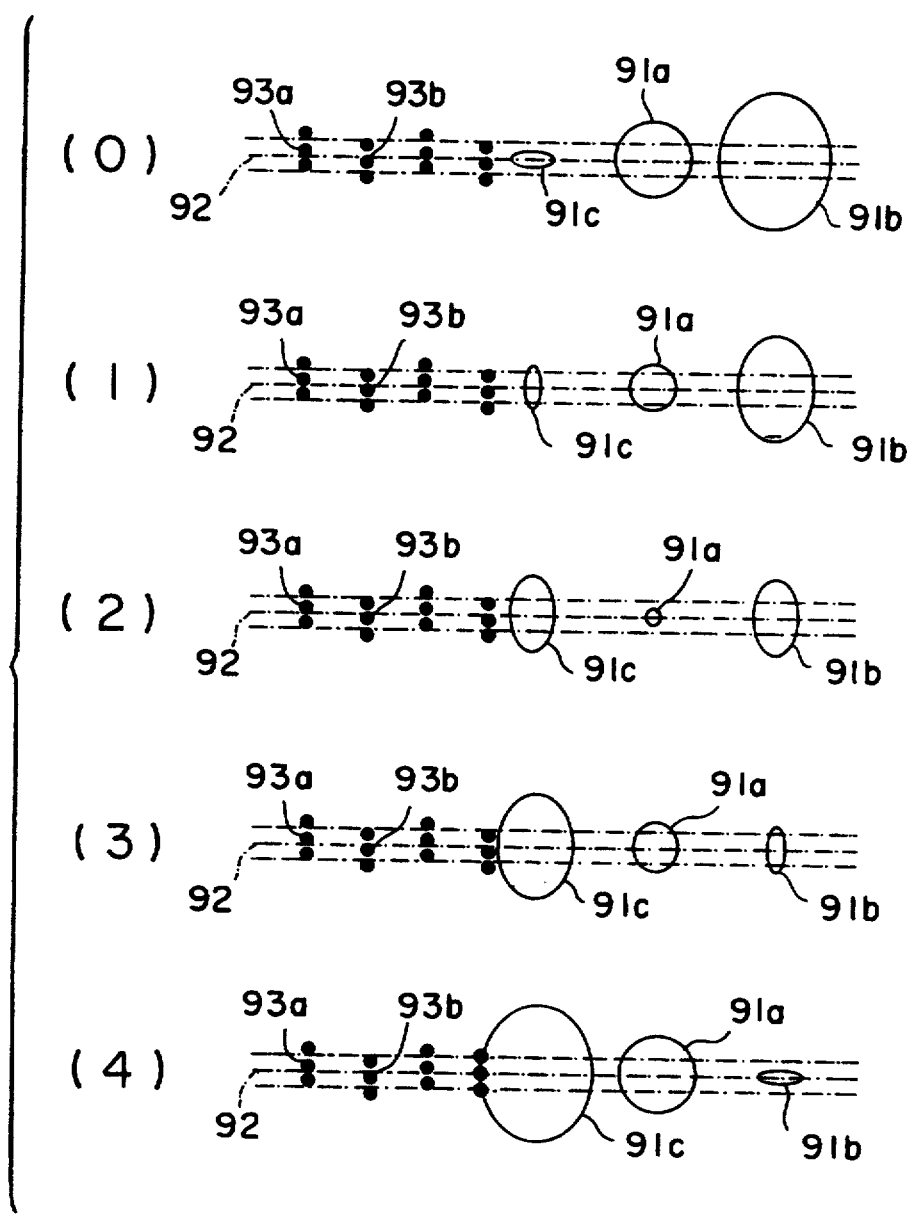
FIG. 15 is a schematic view showing the relation between the information recording surface and the spots by the concentric elliptic diffraction grating.
Figure 16:
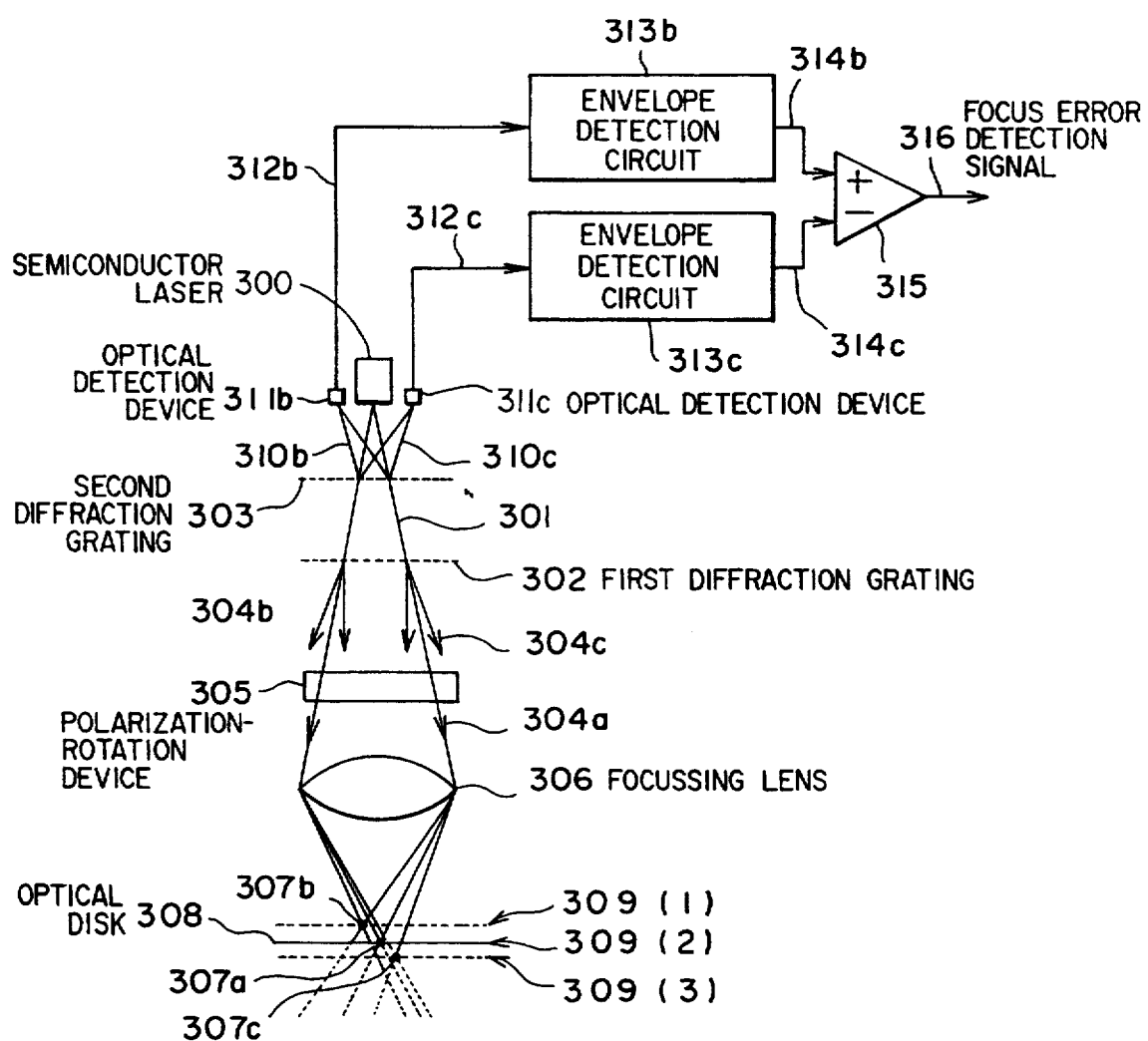
FIG. 16 is a diagram showing the principle of the detection of focus error in the present invention.
Figure 17:
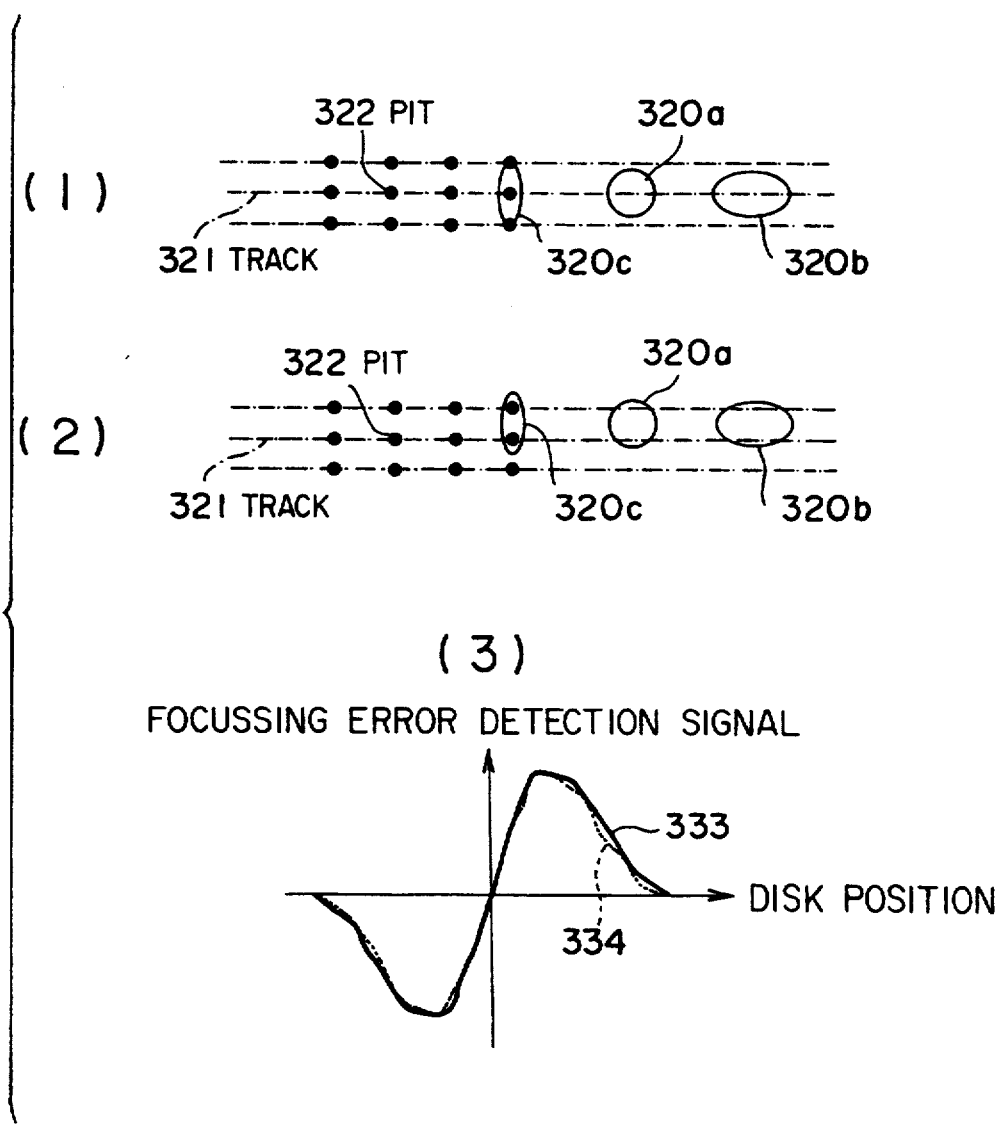
FIG. 17 is a diagrams showing the relation between the optical disk surface and the spots when the focus deviates and is a diagram showing the focus error signal.
Figure 18:
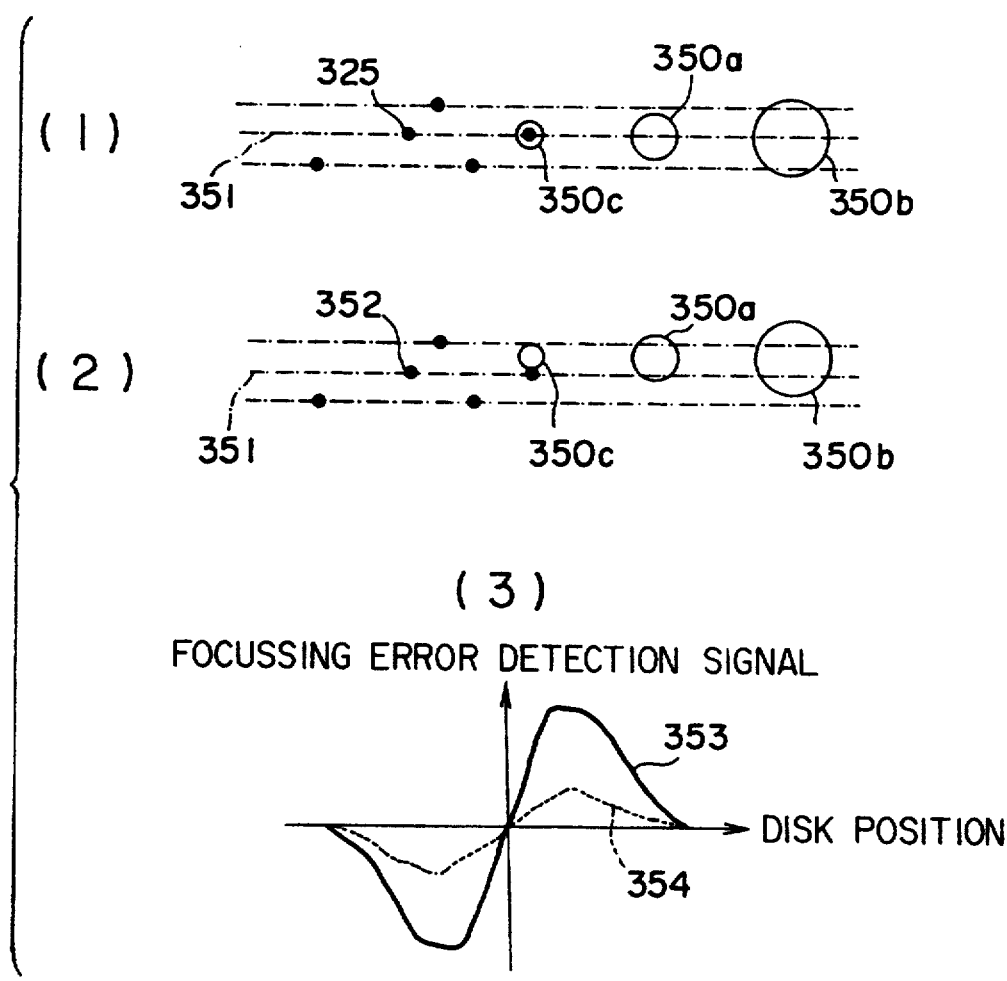
FIG. 18 is a diagram showing the relation between the optical disk surface and the spots when the focus deviates in the prior art and is a diagram showing a conventional focus error signal.

FIG. 15 shows the spot 91$a$ of the main beam 15$a$ of the 0 order diffraction, the spot 91$b$ of the sub-beam 15$b$ of the +1 order diffraction and the spot 91$c$ of the sub-beam 15$c$ of the −1 order diffraction on the surface of the optical disk 22 when the concentric elliptic diffraction grating 201 is used in the same way as in FIG. 8. The transverse direction of the sheet of drawing in FIG. 15 corresponds to the X direction in FIG. 14 (the direction of the major axis of the ellipse 203) and the vertical direction of the sheet of drawing corresponds to the Y direction (the direction of the minor axis of the ellipse 203). The pits 93$a$ and 93$b$ on the track 92 on the surface of the disk 22 represented by one-dot-chain line exhibit the same function as the one explained with reference to FIG. 8. FIG. 14(2) shows the case where the optical disk 22 exists at the focal point of the main beams 15$a$ in the same way as in FIG. 8(2). At this time, the spot 91$a$ is the smallest and is the disk position (the target point of focussing) which is most suitable for recording and reproduction of the information. Since the sub-beams 15$b$ and 15$c$ provide the astigmatisms which are strong in the vertical direction of the sheet of drawing (Y direction) and weak in the transverse direction of the sheet (X direction) provided by the diffraction grating 201, the converging position deviates greatly in the vertical direction of the sheet of drawing, but does a little in the transverse direction. Therefore, they become the elliptic spots 91$b$ and 91$c$ which have the same size and are elongated longitudinally, and the degrees of modulation of the sub-beams 15$b$ and 16$c$ by the pits 93$a$ and 93$b$ become equal to each other.

FIG. 15(1) shows the case where the optical disk 22 exists at the position of the focal line of the −1 order diffraction sub-beam 15c in the X direction. Since the sub-beam 15c is contracted most greatly in the transverse direction, the spot 91c becomes a longitudinally elongated spot. Since each of the pits 93a, 93b is aligned in the radial direction of the disk (in the vertical direction of the sheet of drawing), the sub-beam 15c is modulated most greatly. The spot 91b of the +1 order diffraction grating sub-beams 15b becomes further greater than in the case (2) and the degree of modulation of the sub-beam 15b becomes smaller than that in the case (2). FIG. 15(0) shows the case where the optical disk 22 is further away from the focussing lens 8 and exists at the position of the focal line of the −1 order diffraction sub-beam 15c in the Y direction. Since the sub-beam 15c is contracted in the longitudinal direction this time, the spot 91c becomes a transversely elongated spot and the degree of modulation of the sub-beam 15c becomes smaller than in the case (1). The spot 91b of the subbeam 15b becomes further greater than that in the case (1), and the degree of modulation of the sub-beam 15b becomes further smaller than that in the case (1). On the contrary, FIG. 15(3) shows the case where the optical disk 22 exists at the position of the focal line of the +1 order diffraction sub-beam 15b in the X direction in the same way as in FIG. 8(3). In this case, since the sub-beams is contracted most greatly in the transverse direction, the spot 91b becomes a longitudinally elongated spot. Since each of the pits 93a, 93b is aligned in the radial direction of the disk (in the vertical direction of the sheet of drawing), the sub-beam 15b is contracted most greatly. The spot 91c of the sub-beam 15c becomes further greater than in the case (2), and the degree of modulation of the sub-beam 15c becomes further smaller than in the case (2). FIG. 15(4) shows the case where the optical disk 22 further approaches to the focussing lens 8 and exists, at the position of the focal line of the +1 order diffraction sub-beam 15b in the Y direction. Since the sub-beam 15b is contracted in the longitudinal direction this time, the spot 91b becomes a transversely elongated spot, and the degree of modulation of the sub-beam 15b becomes further smaller than in the case (3). The spot 91c of the sub-beam 15c becomes further greater than in the case (3) and the degree of modulation of the sub-beam 15c becomes further smaller than in the case (3). Therefore, the change of the degrees of modulation of the light power signals 35b and 35c when the change of the position of the optical disk is plotted on the abscissa becomes exactly the same as the one shown in FIG. 9(1). In other words, the amplitude of the light power signal 35c becomes maximal at the disk position (3) and the amplitude of light power signal 35c becomes maximal at the disk position (1). The amplitude of the light power signal 35b and that of the light power signal 35c become equal to each other at the disk position (2). Furthermore, the modulation degree signals 37b, 37c outputted by the envelope detection circuits 36b, 36c become the same as those shown in FIG. 9(2), and the subtraction circuit 38 provides the focus error detection signal 39 such as the one represented by the solid line in FIG. 9(3). The focus error detection signal 39 falls automatically to the zero level when the optical disk 22 exists at the target position !2) of focussing.

The diffraction grating plate 2 and the quarter wavelength plate 5 shown in the first and second embodiments can be integrated by bonding them together. As an example, the explanation will be given on the case where the diffraction grating 4 or 201 on the surface of the diffraction grating plate 2 on the side of the focussing lens 6 and the quarter wavelength plate 5 are bonded together by a UV-curable resin. Assuming that the grooves of the diffraction grating 4 are buried by the UV resin having a refractive index of 1.5, the difference ΔOP of the optical path lengths between the convexities and concavities of the diffraction grating is given as follows:

$$\Delta OP = (n - 1.5)d$$

The ΔOP/λ value obtained from the ordinary beam refractive index $n_o = 2.262$ as the refractive index inside the diffraction grating is represented by a line 254 and the ΔOP/λ value obtained from the extraordinary beam refractive index $n_e = 2.179$ is represented by a line 255. When the groove depth is 2.05 μm, the difference of the optical path lengths is exactly twice the wavelength for the ordinary beam and is 1.8 times for the extraordinary beam. Accordingly, the groove depth of the grating grooves of the diffraction grating 4 on the bonded surface side of the diffraction grating plate 2 or the grating grooves 202 of the diffraction grating 201 may be set to 2.05 μm.

Figure 20:
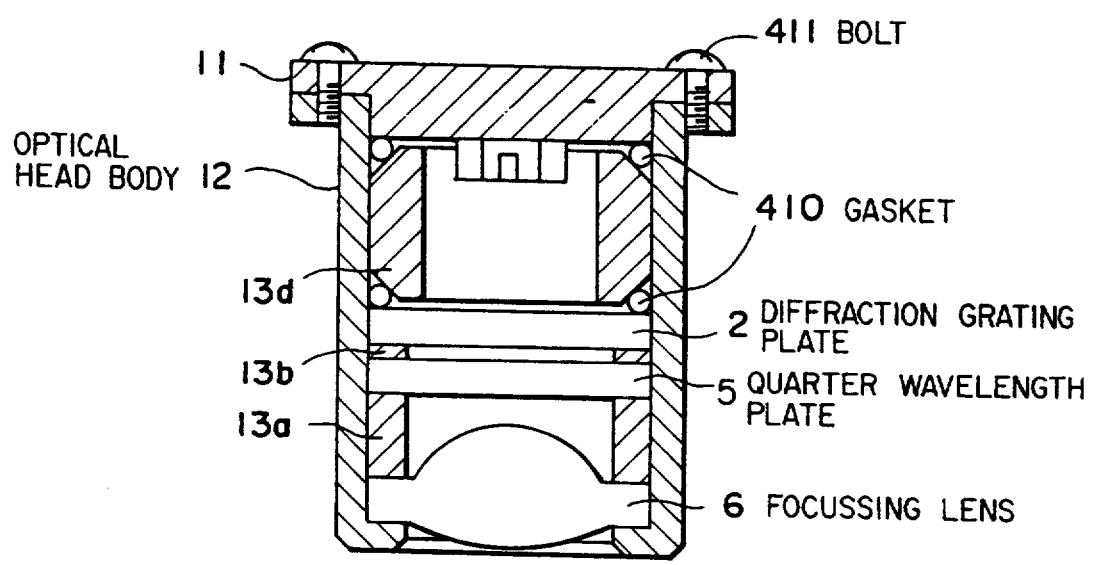
FIG. 20 is an assembly view of the optical head of the present invention.

FIG. 20 is a sectional view useful for explaining another embodiment of the present invention. In the drawing, like reference numerals are used to identify like constituents as in FIG. 1. In the embodiment shown in FIG. 20, the region inside the optical head body 12, which is interposed between the diffraction grating plate 2 and the round substrate 11, is sealed. Ring-like rubber packings 410 are sandwiched between the round substrate 11 and the spacer 13d and between the diffraction grating plate 2 and the spacer 13d and are fastened by screws 411 for sealing. The corner portions which the rubber packings 410 of the spacers 13d strike are diagonally cut so as to keep air-tightness. The assembly work is carried out in the dry nitrogen atmosphere. The most of the assembly works before the screw fastening operation are carried out in the atmosphere, and then the screws 411 may be fastened by a motor inside a vacuum bell jar of a vacuum apparatus.

Advantages with the Invention

The present invention can accomplish a compact optical head capable of maintaining stable performance for an extended period without degradation of the semiconductor laser. The present invention can completely separate the semiconductor laser outgoing beam from the disk reflected beam, can use commonly the optical path of the focussing optical system and that of the detection optical system, and can thus accomplish the beam separation optical system which is effective for scale-down of the optical head.

We claim:

1. An information recording apparatus including an optical head, said optical head comprising:
   a semiconductor laser;
   a focusing optical system for forming spots of outgoing beams from said semiconductor laser on the surface of an information medium;
   a beam separation optical system for separating reflected beams reflected by said information medium from said outgoing beams;
   optical detectors for receiving detection beams separated by said beam separation optical system; and an optical head body for fixing said semiconductor laser, said focusing optical system, said beam separation optical system and said optical detectors;

said semiconductor laser being sealed by said focusing optical system or said beam separation optical system and said optical head body;

wherein said beam separation optical system comprises a first beam separation optical system for separating said outgoing beams outgoing from said semiconductor laser into a main beam and two sub-beams, and a second beam separation optical system for separating a plurality of reflected beams reflected by said information medium in a direction different from said outgoing beams;

wherein said first beam separation optical system further comprises a first diffraction grating or holographic device for providing positive and negative astigmatisms to said two sub-beams;

wherein marks are in advance recorded on the surface of said information medium so as to modulate reflected light power of said sub-beams;

wherein said optical detectors each have two optical detection devices for receiving said sub-beams; and wherein said information recording apparatus further comprises two amplitude detection circuits for detecting magnitudes of amplitudes modulated by said marks from said light power signals outputted from said two optical detection devices, and a focus error detection circuit comprising a subtraction circuit for subtracting said two amplitude detection signals outputted from said amplitude detection circuits.

2. An information recording apparatus according to claim 1, wherein said first diffraction grating or holographic device comprises the aggregate of a plurality of line grooves the grating groove pitch of which varies sequentially, and said marks are aligned in a direction perpendicular to the direction of said track.

3. An information recording apparatus according to claim 1, wherein said first diffraction grating or holographic device comprises part of the aggregate of a plurality of concentric elliplic grooves the grating groove gap of which varies sequentially, the position of concentricity of said concentric elliptic groove pitch eccentric from the position of a main optical axis of said main beam, and said marks are aligned in a direction perpendicular to the direction of said track.

4. An information recording apparatus according to claim 1, wherein said amplitude detection circuit comprises a first sample and hold circuit for holding an output signal level of said optical detection device when each of said two sub-beams exists between said marks, a second sample and hold circuit for holding an output signal level of said optical detection device when each of said two sub-beams exists on said marks, and a subtraction circuit for effecting subtraction between the output signal of said first sample and hold circuit and the output signal of said second sample and hold circuit.

5. An information recording apparatus according to claim 4, wherein said amplitude detection circuit includes a built-in switch circuit for keeping always the polarity of the output signal of said amplitude detection circuit at a positive level or a negative level.

6. An information recording apparatus according to claim 1, wherein said marks comprise a first pit group so disposed as to be spaced apart by a predetermined distance from a predetermined track center line, along which said main spot is guided on the surface of said information medium, on one of the sides of said track center line, and a second pit group so disposed as to be spaced apart by the same distance from said track center line on the other side of said track center line, and a track error detection signal is obtained by comparing the output signal level of said optical detection device when said main spot passes by said first pits with the output signal level of said optical detection device when said main spot passes by said second pits.

7. An optical information recording apparatus according to claim 1, wherein said amplitude detection circuit comprises a first sample and hold circuit for holding an output signal level of said optical detection device when each of said two sub-beams exists between said marks, a second sample and hold circuit for holding an output signal level of sid optical detection device when each of said two sub-beams exists on said marks, a division circuit for outputting a relative proportion between the output signal of sid first sample and hold circuit and the output signal of said second sample and hold circuit.

8. An information recording apparatus according to claim 7, wherein said detection circuit includes a gain adjustable circuit for adjusting the gain between the output signal of said first sample and hold circuit and the output signal of said second sample and hold circuit.

9. An information recording apparatus according to claim 1, wherein said semiconductor laser is sealed by said focusing optical system and said optical head body.

10. An optical head comprising:
a semiconductor laser;
a focusing optical system for forming spot of outgoing beams from said semiconductor laser on the surface of an information medium;
a beam separation optical system for separating reflected beams reflected by said information medium from said outgoing beams;
optical detectors for receiving detection beams separated by said beam separation optical system; and
an optical head body for fixing said semiconductor laser, said focusing optical system, said beam separation optical system and said optical detectors;
wherein said semiconductor laser is sealed by said focusing optical system and said optical head body; and
wherein said beam separation optical system further comprises a second beam separation optical system for separating said reflected beams reflected by said information medium in the direction different from said outgoing beam comprises a diffraction grating plate equipped on at least one of the surface thereof with a second diffraction grating made df a bi-refrigerence material and polarization-rotation means for rotating a polarizing direction so that said reflected beam becomes either an extraordinary beam or an ordinary beam when said reflected beam passes through said second diffraction grating, and the convexities and concavities of said diffraction grating have the difference of their optical path lengths which is substantially equal to $(N+0.05)\lambda$ where N is an integer and $\lambda$ is the wavelength of said extraordinary beam of said ordinary beam, and their widths are substantially equal to each other.

11. An optical head according to claim 10, wherein the convexities and concavities of said second diffraction grating have the difference of their optical path lengths which is substantially equal to $N\lambda$.

12. An optical head according to claim 10, wherein said polarization-rotation means is a quarter wavelength plate.

13. An optical head according to claim 12, wherein said diffraction grating plate and said quarter wavelength plate are integrated with each other.

14. An optical head according to claim 10, wherein a first diffraction plate is formed on the other surface of said diffraction grating plate having said second diffraction grating.

15. An optical head according to claim 14, wherein said first diffraction grating is made of a birefringence material, and said convexities and concavities of said first diffraction grating have the difference of their optical path lengths which substantially equal to $N\lambda$, and their widths are substantially equal to each other.

16. An optical information processing apparatus comprising:

a light source;

an information medium;

a focusing optical system for forming spots of a main beam emitted from said light source as a main spot on the surface of said information medium;

a separation optical system for separating reflected beams from said information medium;

optical detectors for receiving said reflected beams;

a diffraction grating or a holographic device for generating sub-beams emitted in directions different by a very fine angle from said main beam, and having a positive focus error or an astigmatism and a negative focus error or an astigmatism;

pits for modulating reflected light power of said sub-beams, recorded in advance on the surface of said information medium;

two optical detection devices for receiving said sub-beams reflected from said information medium, respectively;

two amplitude detection circuits for detecting the magnitudes of the amplitudes modulated by said pits from light power signals outputted by said two optical detection devices; and a subtraction circuit for obtaining a focus error signal by effecting subtraction between two amplitude detection signals outputted from said amplitude detection circuits;

wherein said amplitude detection circuits each comprises a first sample and hold circuit for holding the output signal level of said optical detection device wherein a $+1$ order beam or a $-1$ order beam exists between said pits, a second sample and hold circuit for holding the output signal level of said optical detection device when said $+1$ order beam or said $-1$ order beam exists on said pits, a division circuit for effecting division between the output signal of said first sample and hold circuit and the output signal of said second sample and hold circuit, and a gain adjustable circuit for adjusting the gains between the output signal of said first sample and hold circuit and the output signal of said second sample and hold circuit.

17. An optical information processing apparatus according to claim 16, wherein said amplitude detection circuit is equipped with a judgement circuit for dividing the output signal of said first sample and hold circuit by the output signal of said second sample and hold circuit, or the output signal of said second sample and hold circuit by the output signal of said first sample and hold circuit.

* * * * *